(12) United States Patent
Baek et al.

(10) Patent No.: US 11,744,114 B2
(45) Date of Patent: Aug. 29, 2023

(54) DISPLAY DEVICE

(71) Applicant: Samsung Display Co., LTD., Yongin-si (KR)

(72) Inventors: Seung In Baek, Seongnam-si (KR); Gun Shik Kim, Yongin-si (KR); Mi Ra Gwon, Hwaseong-si (KR); Young Jun Yoo, Goyang-si (KR); Young Eun Park, Seoul (KR); Jung Hwan Yi, Hwaseong-si (KR); Su Jin Choi, Seoul (KR); Youn Ho Han, Seoul (KR); Jong Beom Hong, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 174 days.

(21) Appl. No.: 17/060,718

(22) Filed: Oct. 1, 2020

(65) Prior Publication Data

US 2021/0104586 A1   Apr. 8, 2021

(30) Foreign Application Priority Data

Oct. 8, 2019   (KR) .................. 10-2019-0124432

(51) Int. Cl.
*H01L 33/50* (2010.01)
*H10K 59/122* (2023.01)
(Continued)

(52) U.S. Cl.
CPC ......... *H10K 59/122* (2023.02); *H10K 50/844* (2023.02); *H10K 50/854* (2023.02); *H10K 59/38* (2023.02); *H10K 71/00* (2023.02)

(58) Field of Classification Search
CPC ............... H01L 27/3246; H01L 27/322; H01L 51/5253; H01L 51/5268; H01L 51/56;
(Continued)

(56) References Cited

U.S. PATENT DOCUMENTS 6,995,736 B2   2/2006   Eida
7,227,518 B2   6/2007   Eida
(Continued)

FOREIGN PATENT DOCUMENTS

EP          1178709        2/2002
KR    10-2016-0080077      7/2016
(Continued)

OTHER PUBLICATIONS

Extended Search Report corresponding to European Patent Application No./Patent No. 20200635.9 dated Mar. 2, 2021.
(Continued)

*Primary Examiner* — Kevin Quarterman
(74) *Attorney, Agent, or Firm* — Kile Park Reed & Houtteman PLLC

(57) ABSTRACT

A display device includes a first base substrate including a light-emitting area and a non-light-emitting area around the light-emitting area, a wavelength conversion pattern on the first base substrate in the light-emitting area, and a light-emitting element layer on the wavelength conversion pattern. The light-emitting element layer includes a pixel electrode including a first conductive pattern between the wavelength conversion pattern and the first base substrate, and a second conductive pattern on the wavelength conversion pattern and spaced apart from the first conductive pattern, an organic light-emitting layer on the second conductive pattern, and a common electrode on the organic light-emitting layer.

18 Claims, 20 Drawing Sheets

(51) Int. Cl.
   *H10K 50/844* (2023.01)
   *H10K 50/854* (2023.01)
   *H10K 59/38* (2023.01)
   *H10K 71/00* (2023.01)

(58) Field of Classification Search
   CPC . H01L 33/504; H01L 25/0753; H01L 33/507; H01L 2251/5315; H01L 51/5218; H01L 27/3248; H01L 27/3262; H01L 27/3211; H01L 27/3244; H01L 51/52
   See application file for complete search history.

(56) References Cited

U.S. PATENT DOCUMENTS

| | | |
|---|---|---|
| 2006/0012288 A1 | 1/2006 | Terakado et al. |
| 2006/0152151 A1 | 7/2006 | Seo |
| 2016/0225828 A1 | 8/2016 | Lee et al. |
| 2018/0120646 A1* | 5/2018 | Lee ........................ H01L 27/322 |
| 2019/0189969 A1 | 6/2019 | Youn et al. |
| 2019/0221623 A1* | 7/2019 | Kamiyama ......... H01L 51/0021 |
| 2019/0348480 A1* | 11/2019 | Wu ...................... H01L 27/3272 |
| 2019/0355928 A1* | 11/2019 | Narutaki ............... G02F 1/1335 |
| 2020/0013766 A1* | 1/2020 | Kim ...................... H01L 25/167 |
| 2020/0091464 A1* | 3/2020 | Park .................... H01L 51/5275 |
| 2022/0085114 A1* | 3/2022 | Seong ................... H01L 27/322 |

FOREIGN PATENT DOCUMENTS

| | | |
|---|---|---|
| KR | 10-2017-0057041 | 5/2017 |
| KR | 10-2017-0063246 | 6/2017 |

OTHER PUBLICATIONS

European Office Action for European Patent Application No. 20 200 635.9, dated May 23, 2023.

* cited by examiner

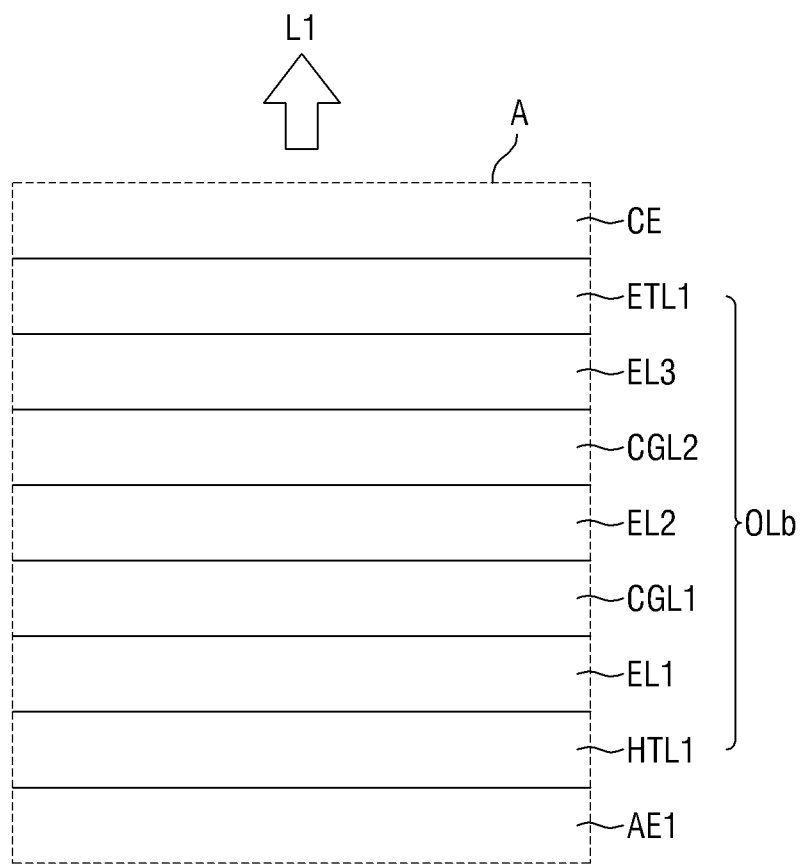

DISPLAY DEVICE

CROSS REFERENCE TO RELATED APPLICATION(S)

This application claims priority to and benefits of Korean Patent Application No. 10-2019-0124432 under 35 U.S.C. § 119, filed in the Korean Intellectual Property Office on Oct. 8, 2019, the entire contents of which are incorporated herein by reference.

BACKGROUND

1. Technical Field

The disclosure relates to a display device and a method of manufacturing a display device.

2. Description of the Related Art

Display devices have increasingly become important with the development of multimedia. Accordingly, various display devices such as a liquid crystal display device (LCD), an organic light-emitting diode (OLED) display device, and the like have been developed.

The OLED display device may include OLEDs, which are self-luminous elements. An OLED may include two electrodes facing each other and an organic light-emitting layer interposed between the two electrodes. Electrons and holes from the two electrodes may recombine in the light-emitting layer to generate excitons. In response to the transition of the excitons from an excited state to a ground state, light may be emitted.

Since the OLED display device does not need a separate light source, the OLED display device has been spotlighted as a next-generation display device because of numerous advantages such as low power consumption, thinness, light-weightness, wide viewing angles, high luminance and contrast, and fast response speed.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An embodiment provides a display device having the physical distance, in each pixel, between a wavelength conversion pattern and an organic light-emitting layer reduced.

An embodiment provides a method of manufacturing a display device having the physical distance, in each pixel, between a wavelength conversion pattern and an organic light-emitting layer reduced.

Additional features will be set forth in the description which follows, and in part will be apparent from the description, or may be learned by practice of the disclosure.

According to an embodiment, a display device may include: a first base substrate including a light-emitting area and a non-light-emitting area around the light-emitting area; a wavelength conversion pattern disposed on the first base substrate, in the light-emitting area; and a light-emitting element layer disposed on the wavelength conversion pattern. The light-emitting element layer may include a pixel electrode including a first conductive pattern disposed between the wavelength conversion pattern and the first base substrate and a second conductive pattern disposed on the wavelength conversion pattern and spaced apart from the first conductive pattern, an organic light-emitting layer disposed on the second conductive pattern, and a common electrode disposed on the organic light-emitting layer.

The first conductive pattern may include a first conductive film disposed between the wavelength conversion pattern and the first base substrate, and a second conductive film disposed between the first conductive film and the wavelength conversion pattern.

The first conductive film may include a conductive oxide, the second conductive film may include a metal, and the second conductive pattern may include a conductive oxide.

The second conductive pattern may cover sides of the wavelength conversion pattern and may contact with the second conductive film.

The display device may further include a pixel-defining film disposed on the first base substrate, in the non-light-emitting area, wherein the pixel-defining film may contact sides of the second conductive pattern.

The display device may further include: an inorganic capping layer disposed on sides of the wavelength conversion pattern, wherein the second conductive pattern may be disposed on the inorganic capping layer.

The second conductive pattern may be disposed on sides of the inorganic capping layer.

The inorganic capping layer may cover and contact the sides of the wavelength conversion pattern.

The display device may further include: a barrier wall disposed on sides of the wavelength conversion pattern and the second conductive pattern; and a third conductive pattern disposed between a side of the barrier wall and a side of the wavelength conversion pattern.

The third conductive pattern may cover sides and a top surface of the barrier wall.

The wavelength conversion pattern may include wavelength conversion particles that convert the wavelength of light emitted from the light-emitting element layer.

The wavelength conversion pattern may further include scattering particles that may scatter light emitted from the light-emitting element layer.

The organic light-emitting layer may include two or more organic layers.

The display device may further include: a thin-film encapsulation layer disposed on the common electrode and spaced apart from the pixel electrode; and a color filter disposed on the thin-film encapsulation layer and spaced apart from the common electrode.

The display device may further include: a second base substrate disposed on the color filter; and a filler member disposed between the color filter and the thin-film encapsulation layer.

According to an embodiment, a display device may include: a base substrate including a light-emitting area and a non-light-emitting area around the light-emitting area; a wavelength conversion pattern disposed on the base substrate, in the light-emitting area; and a light-emitting element layer disposed between the wavelength conversion pattern and the base substrate. The light-emitting element layer may include a pixel electrode disposed between the wavelength conversion pattern and the base substrate, an organic light-emitting layer disposed between the wavelength conversion pattern and the pixel electrode, and a common electrode disposed between the organic light-emitting layer and the wavelength conversion pattern.

The display device may further include an inorganic capping layer disposed between the common electrode and the wavelength conversion pattern.

The display device may further include: a first inorganic encapsulation film disposed between the inorganic capping layer and the wavelength conversion pattern; a second inorganic encapsulation film disposed on the wavelength conversion pattern; an organic encapsulation film disposed on the second inorganic encapsulation film; and a third inorganic encapsulation film disposed on the organic encapsulation film.

According to an embodiment of the disclosure, a method of manufacturing a display device may include forming a first conductive pattern on a base substrate; forming a wavelength conversion pattern on the first conductive pattern; forming a second conductive pattern on the wavelength conversion pattern; forming an organic light-emitting layer on the second conductive pattern; and forming a common electrode on the organic light-emitting layer.

The forming the first conductive pattern may include forming a first conductive film on the base substrate and forming a second conductive film on the first conductive film.

The first conductive film may include a conductive oxide, the second conductive film may include a metal, and the second conductive pattern may include a conductive oxide.

The forming the second conductive pattern may include forming the second conductive pattern over sides of the wavelength conversion pattern and in contact with the second conductive film.

The method may further include, between the forming the wavelength conversion pattern and the forming the second conductive pattern, forming an inorganic capping layer over sides of the wavelength conversion pattern and in contact with the wavelength conversion pattern, wherein the forming the second conductive pattern may include forming the second conductive pattern on the inorganic capping layer.

The forming the second conductive pattern may further include forming the second conductive pattern on sides of the inorganic capping layer.

According to the aforementioned and other embodiments of the disclosure, the physical distance, in each pixel, between a wavelength conversion pattern and an organic light-emitting layer may be reduced.

Other features and embodiments may be apparent from the following detailed description, the drawings, and the claims.

BRIEF DESCRIPTION OF THE DRAWINGS

The above and other embodiments and features of the disclosure will become more apparent by describing in detail embodiments thereof with reference to the attached drawings, in which:

FIGS. 4A through 4C are enlarged schematic cross-sectional views of a part A of FIG. 3;

DETAILED DESCRIPTION OF THE EMBODIMENTS

Figure 1:
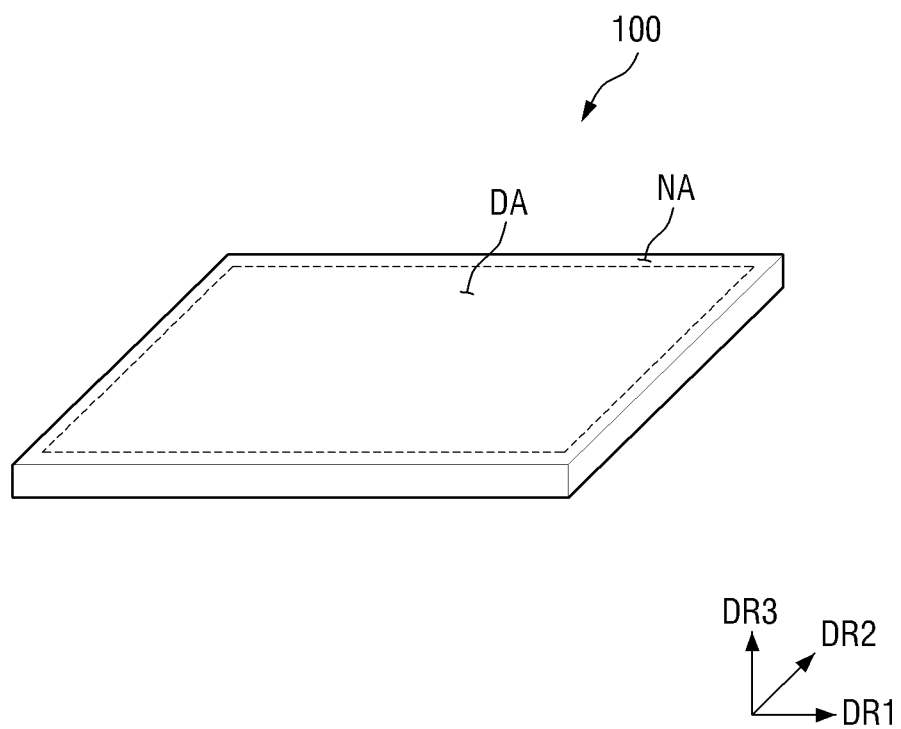
FIG. 1 is a perspective view of a display panel of a display device according to an embodiment.

Although the disclosure may be modified in various manners and have additional embodiments, embodiments are illustrated in the accompanying drawings and will be mainly described in the specification. However, the scope of the disclosure is not limited to the embodiments in the accompanying drawings and the specification and should be construed as including all of the changes, equivalents, and substitutions included in the spirit and scope of the disclosure.

Some of the parts which are not associated with the description may not be provided in order to describe embodiments of the disclosure and like reference numerals refer to like elements throughout the specification.

In the drawings, sizes and thicknesses of elements may be enlarged for better understanding, clarity, and ease of description thereof. However, the disclosure is not limited to the illustrated sizes and thicknesses. In the drawings, the thicknesses of layers, films, panels, regions, and other elements, may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a schematic cross-sectional view" means when a schematic cross-section taken by vertically cutting an object portion is viewed from the side. In addition, in this specification, the phrase "on a plane" means viewing a target portion from the top.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

It will be understood that when an element is referred to as being related to another element such as being "coupled" or "connected" to another element, it can be directly coupled or connected to the other element or intervening elements may be present therebetween.

In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in a similar way.

Throughout the specification, the same reference numerals will refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

It will be further understood that the terms "comprises" and/or "comprising," or "includes" and/or "including" when used in this specification, may specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompass both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein. Embodiments are described herein with reference to schematic cross section illustrations that are schematic illustrations of sample embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments will be described with reference to the attached drawings.

Figure 2:
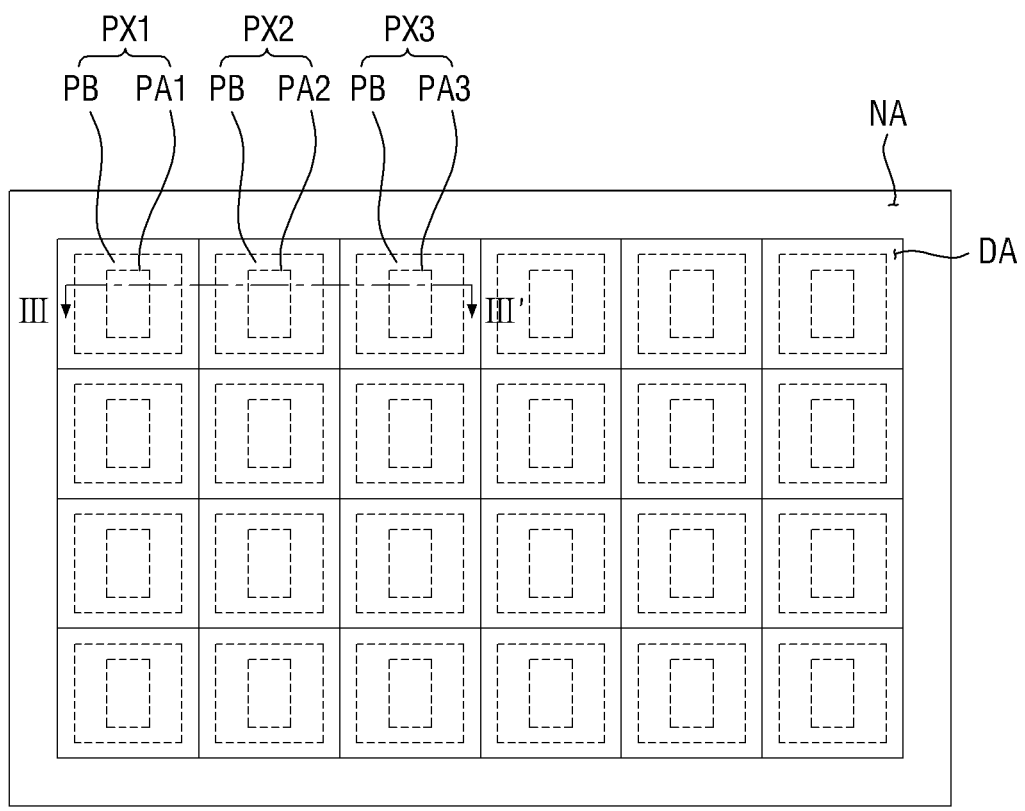
FIG. 2 is a layout view of the display panel of FIG. 1.
Figure 2:
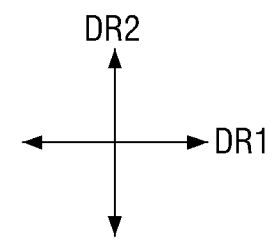
Figure 3:
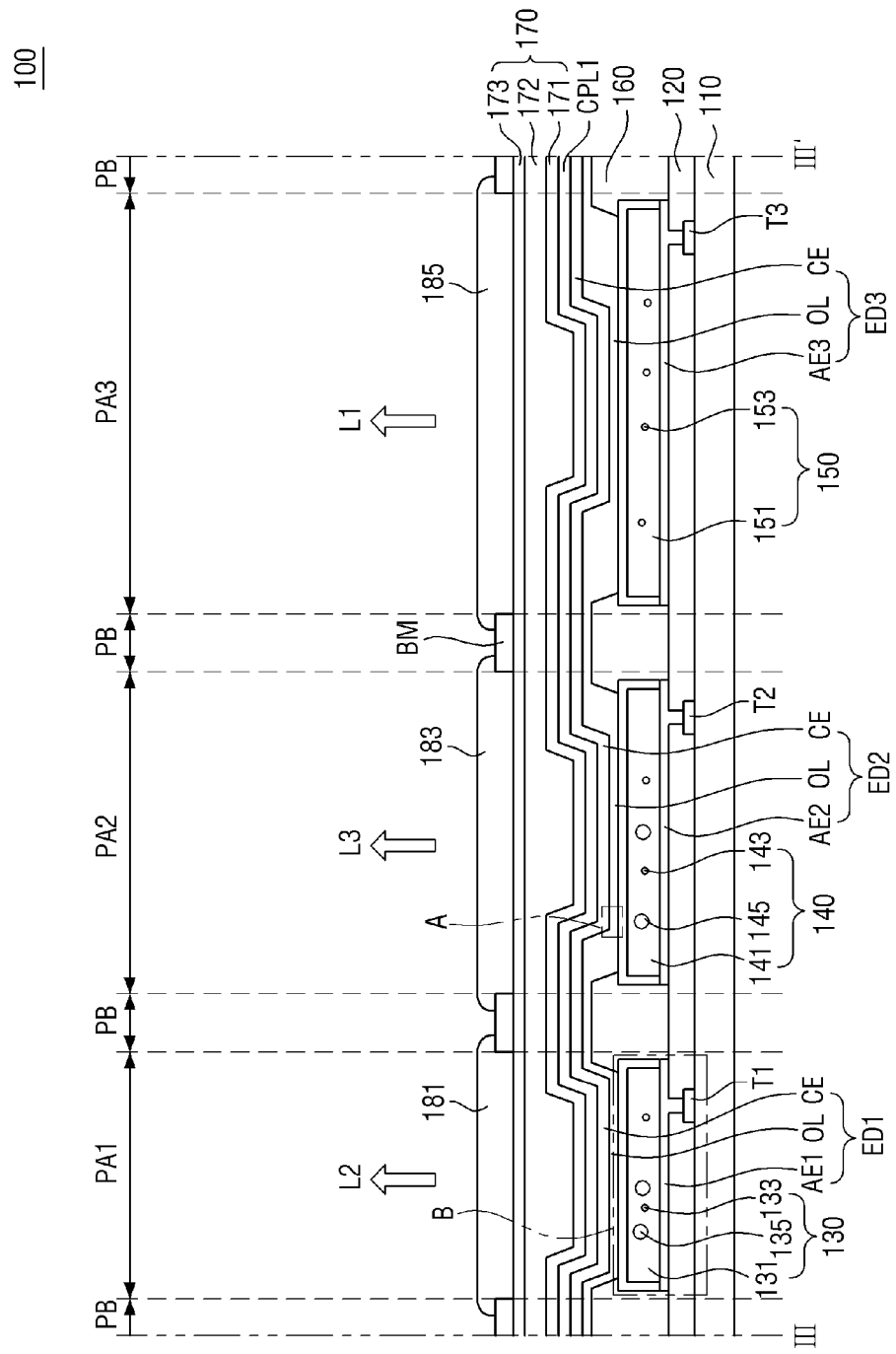
FIG. 3 is a schematic cross-sectional view taken along line of FIG. 2.
Figure 4A:
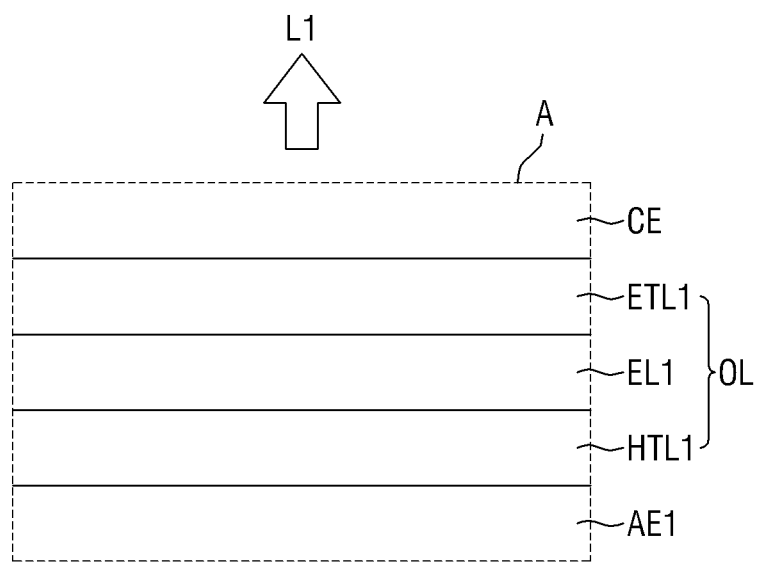
Figure 4B:
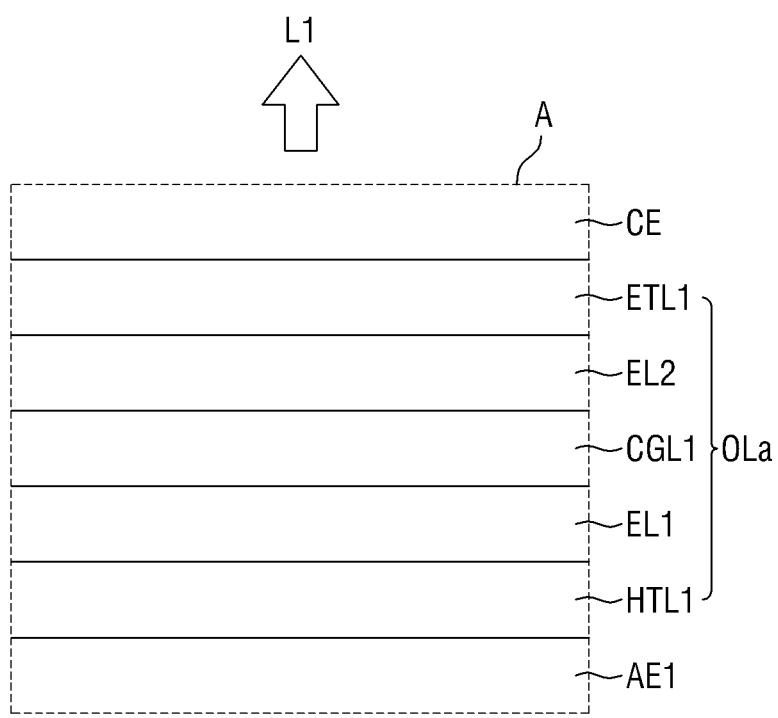
Figure 5:
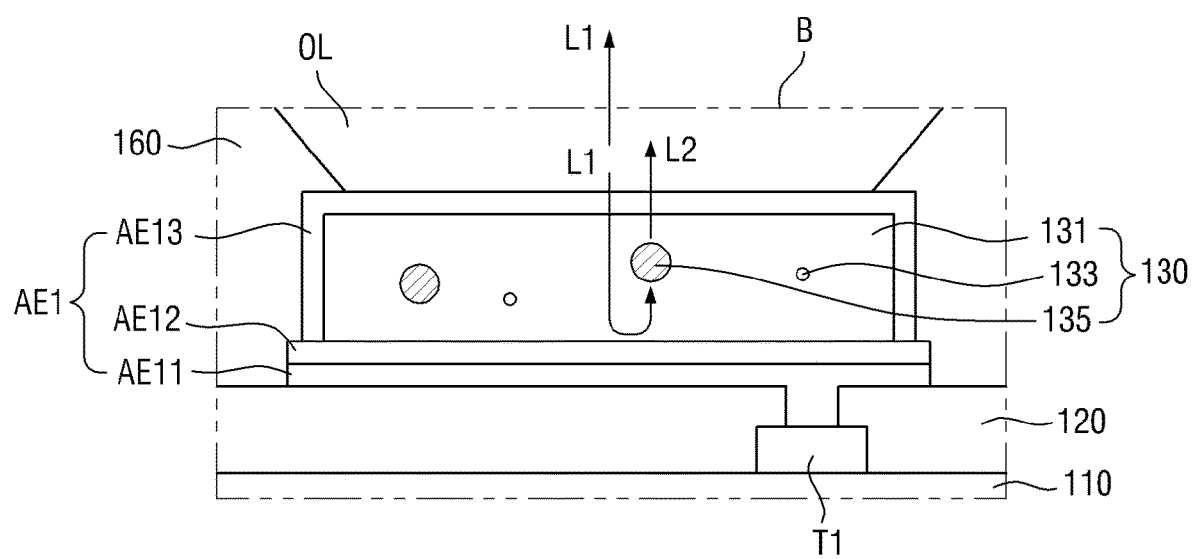
FIG. 5 is an enlarged schematic cross-sectional view of a part B of FIG. 3.

FIG. 1 is a perspective view of a display panel of a display device according to an embodiment, FIG. 2 is a layout view of the display panel of FIG. 1, FIG. 3 is a schematic cross-sectional view taken along line of FIG. 2, FIGS. 4A through 4C are enlarged schematic cross-sectional views of a part A of FIG. 3, and FIG. 5 is an enlarged schematic cross-sectional view of a part B of FIG. 3.

Referring to FIGS. 1 through 5, a display device may be applicable to various electronic devices such as a tablet personal computer (PC), a smartphone, a navigation unit, a camera, a central information display (CID) provided in an automobile, a wristwatch-type electronic device, a personal digital assistant (PDA), a portable multimedia player (PMP), a small- or medium-sized electronic device such as a gaming device, a television (TV), an outdoors billboard, a monitor, a PC, or a notebook computer, but the disclosure is not limited thereto. For example, the display device may also be applicable to various electronic devices other than those set forth herein.

The display device may have a rectangular shape in a plan view. The display device may include a pair of short sides extending in one direction and a pair of long sides extending in another direction that may intersect the direction in which the short sides extend. For example, the long sides of the display device may extend in a first direction DR1, and the short sides of the display device may extend in a second direction DR2 that may intersect the first direction DR1 in a plan view. The corners at which the long sides and the short sides of the display device may meet may be right-angled in a plan view, but the disclosure is not limited thereto. Alternatively, the corners at which the long sides and the short sides of the display device may meet may be rounded. The planar shape of the display device is not particularly limited, and the display device may have various shapes other than a rectangular shape, such as a circular, square, or elliptical shape, or other shapes within the spirit and the scope of the disclosure.

The display device may include a display panel 100. The planar shape of the display panel 100 may be the same as, or similar to, the planar shape of the display device. For example, the display panel 100 may have a rectangular shape in a plan view and may include a pair of long sides extending in the first direction DR1 and a pair of short sides extending in the second direction DR2. The corners at which the long sides and the short sides of the display panel 100 may meet may be, but not limited to, right-angled or rounded.

The display panel 100 may include a display area DA in which an image or images may be displayed and a non-display area NA in which no image or images may be displayed.

The display area DA may be located or disposed in a central part of the display panel 100. The display area DA may include pixels (PX1, PX2, and PX3). The pixels (PX1, PX2, and PX3) may include a first pixel PX1 which may emit light of a first color (e.g., red light having a peak wavelength in a range of about 610 nm to about 650 nm), a second pixel PX2 which may emit light of a second color (e.g., green light having a peak wavelength in a range of about 510 nm to about 550 nm), and a third pixel PX3 which may emit light of a third color (e.g., blue light having a peak wavelength in a range of about 430 nm to about 470 nm). The first, second, and third pixels PX1, PX2, and PX3 may be alternately arranged in rows and columns. The pixels (PX1, PX2, and PX3) may be arranged in various arrangements such as a stripe arrangement or a PenTile arrangement.

FIG. 2 illustrates that the first, second, and third pixels PX1, PX2, and PX3 may have the same size, but the disclosure is not limited thereto. Alternatively, the first, second, and third pixels PX1, PX2, and PX3 may have different sizes.

The pixels (PX1, PX2, and PX3) may include light-outputting areas (PA1, PA2, and PA3) and non-light-outputting areas PB. The light-outputting areas (PA1, PA2, and PA3) may be defined as areas from which light may be emitted through a display surface, and the non-light-outputting areas PB may be defined as areas from which no light may be emitted through the display surface. The non-light-outputting areas PB may be located or located or disposed to surround the light-outputting areas (PA1, PA2, and PA3). The light-outputting areas (PA1, PA2, and PA3) and the non-light-outputting areas PB may be defined by a light-shielding member BM that will be described later.

The pixels (PX1, PX2, and PX3) may include light-emitting areas. The light-emitting areas may be defined as areas in which light may be emitted by an organic layer. Non-light-emitting areas may be located or located or disposed around the light-emitting areas. The light-emitting areas and the non-light-emitting areas may be defined by a bank layer or a pixel-defining film 160.

The light-emitting areas may overlap the light-outputting areas (PA1, PA2, and PA3) in a thickness direction. The light-emitting areas may correspond to the light-outputting areas (PA1, PA2, and PA3) in the thickness direction. The light-emitting areas may have a smaller size than the light-outputting areas (PA1, PA2, and PA3) in a plan view, but the disclosure is not limited thereto. Alternatively, the light-emitting areas may have substantially the same size as the light-outputting areas (PA1, PA2, and PA3).

The wavelengths of light emitted from the pixels (PX1, PX2, and PX3) may be controlled not only by light emitted from the light-emitting areas, but also by wavelength conversion layers or color filters that may be located or disposed to overlap the first, second, and third light-emitting areas. For example, first, second, and third light-emitting areas of the first, second, and third pixels PX1, PX2, and PX3 may emit light of the same wavelength (e.g., blue light), and the light emitted by the first, second, and third light-emitting areas may be converted into different colors by the wavelength conversion layers and/or the color filters of the first, second, and third pixels PX1, PX2, and PX3.

The non-display area NA may be located or disposed on the outside of the display area DA and may surround the display area DA. The non-display area NA may include dummy light-emitting areas that may have substantially the same structure as light-emitting areas, but may be controlled not to emit light. Alternatively, the non-display area NA may include light-emitting areas, but the emission of light from the light-emitting areas in a display direction may be blocked by the light-shielding member BM.

Referring to FIG. 3, the display panel 100 may include a first base substrate 110, switching or driving elements (T1, T2, and T3), an insulating film 120, the pixel-defining film 160, organic light-emitting elements (ED1, ED2, and ED3), wavelength conversion/light transmission patterns (130, 140, and 150), and a thin-film encapsulation layer 170.

The display panel 100 may be a thin-film transistor (TFT) substrate or an organic light-emitting substrate including the switching elements (T1, T2, and T3) and the organic light-emitting elements (ED1, ED2, and ED3).

The first base 110 may be formed of a light-transmitting material. The first base substrate 110 may be a glass substrate or a plastic substrate.

On the first base substrate 110, one or more switching elements (T1, T2, and T3) may be located or disposed in each of the pixels (PX1, PX2, and PX3). Although not illustrated, multiple signal wires (e.g., gate wires, data wires, power wires, and the like) may be located or disposed on the first base substrate 110 to transmit signals to the switching elements (T1, T2, and T3).

The insulating film 120 may be located or disposed on the switching elements (T1, T2, and T3). The insulating film 120 may be formed as an organic film. For example, the insulating film 120 may include an acrylic resin, an epoxy resin, an imide resin, or an ester resin.

The wavelength conversion patterns (130, 140, and 150) may be located or disposed in the light-outputting areas (PA1, PA2, and PA3) of the pixels (PX1, PX2, and PX3). For example, a first wavelength conversion pattern 130 may be located or disposed in the first light-outputting area PA1 of the first pixel PX1, a second wavelength conversion pattern 140 may be located or disposed in the second light-outputting area PA2 of the second pixel PX2, and a light transmission pattern 150 may be located or disposed in the third light-outputting area PA3 of the third pixel PX3. The first wavelength conversion pattern 130 may not be located or disposed in the second and third light-outputting areas PA2 and PA3, the second wavelength conversion pattern 140 may not be located or disposed in the first and third light-outputting areas PA1 and PA3, and the light transmission pattern 150 may not be located or disposed in the first and second light-outputting areas PA1 and PA2. However, the disclosure is not limited thereto.

The first wavelength conversion pattern 130 may convert or shift the peak wavelength of incident light into the peak wavelength of another light. The first wavelength conversion pattern 130 may convert blue light L1 into red light L2 and may emit the red light L2.

The first wavelength conversion pattern 130 may include a first base resin 131 and a first wavelength shifter 135, which may be dispersed in the first base resin 131, and may include a first scatterer 133, which may be dispersed in the first base resin 131.

The material of the first base resin 131 is not particularly limited as long as it has high light transmittance and has an excellent dispersion characteristic for the first wavelength shifter 135 and the first scatterer 133. For example, the first base resin 131 may include an organic material such as an epoxy resin, an acrylic resin, a cardo resin, or an imide resin.

The first wavelength shifter 135 may convert or shift the peak wavelength of the incident light into a predetermined peak wavelength. Examples of the first wavelength shifter 135 may include quantum dots, quantum rods, and a phosphor. For example, the quantum dots may be a particulate material that emits light of a particular color in response to the transition of electrons from a conduction band to a valance band.

The quantum dots may be a semiconductor nanocrystal material. Since the quantum dots have a predetermined band gap depending on their composition and size, the quantum dots may absorb light and emit light of a predetermined wavelength. The semiconductor nanocrystal material may include a group IV element, a group II-VI compound, a group III-V compound, a group IV-VI compound, or a combination thereof.

Examples of the group IV element may include silicon (Si), germanium (Ge), and a binary compound such as silicon carbide (SiC) or silicon-germanium (SiGe), but the disclosure is not limited thereto.

Examples of the group II-VI compound may include: a binary compound selected from among CdSe, CdTe, ZnS, ZnSe, ZnTe, ZnO, HgS, HgSe, HgTe, MgSe, MgS, and a mixture thereof; a ternary compound selected from among CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from among HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof, but the disclosure is not limited thereto.

Examples of the group III-V compound may include: a binary compound selected from among GaN, GaP, GaAs, GaSb, AlN, AlP, AlAs, AlSb, InN, InP, InAs, InSb, and a mixture thereof; a ternary compound selected from among GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a mixture thereof; and a quaternary compound selected from among GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

Examples of the group IV-VI compound may include: a binary compound selected from among SnS, SnSe, SnTe, PbS, PbSe, PbTe, and a mixture thereof; a ternary compound selected from among SnSeS, SnSeTe, SnSTe, PbSeS, PbSeTe, PbSTe, SnPbS, SnPbSe, SnPbTe, and a mixture thereof; and a quaternary compound selected from among SnPbSSe, SnPbSeTe, SnPbSTe, and a mixture thereof, but the disclosure is not limited thereto.

The quantum dots may have a core-shell structure consisting of a core including the above-described semiconductor nanocrystal material and a shell surrounding the core. The shells of the quantum dots may serve as protective layers for maintaining the semiconductor characteristics of the quantum dots by preventing chemical denaturation of the cores of the quantum dots and/or as charging layers for imparting electrophoretic characteristics to the quantum dots. The shells of the quantum dots may have a single-layer structure or a multilayer structure. The shells of the quantum dots may include a metal or non-metal oxide, a semiconductor compound, or a combination thereof.

For example, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO or a ternary compound such as $MgAl_2O_4$, $CoFe_2O_4$, $NiFe_2O_4$, or $CoMn_2O_4$, but the disclosure is not limited thereto.

For example, the semiconductor compound may be CdS, CdSe, CdTe, ZnS, ZnSe, ZnTe, GaAs, GaP, GaSb, HgS, HgSe, HgTe, InAs, InP, InSb, AlAs, AlP, or AlSb, but the disclosure is not limited thereto.

Light emitted by the first wavelength shifter 135 may have a full width at half maximum of about 45 nm or less, about 40 nm or less, or about 30 nm or less, and thus, the purity of colors displayed by the display device and the color reproducibility of the display device may be improved. The first wavelength shifter 135 may emit light in various directions regardless of the incidence direction of the light. The side visibility of the red color L2 displayed in the first light-outputting area PA1 may be improved.

Some of the blue L1 provided from the first light-emitting area of the first pixel PX1 may be emitted through the first wavelength conversion pattern 130 without being converted into red light L2 by the first wavelength shifter 135. Blue light L1 incident upon a first color filter 181 without being converted by the first wavelength conversion pattern 130 may be blocked by the first color filter 181. On the contrary, the red light L2 produced by the first wavelength conversion pattern 130 may be emitted to the outside of the display device through the first color filter 181.

The first scatterer 133 may have a different refractive index from the first base resin 131 and may form an optical interface with the first base resin 131. For example, the first scatterer 133 may include light-scattering particles. The material of the first scatterer 133 is not particularly limited as long as it can scatter at least some light passing therethrough. For example, the first scatterer 133 may include metal oxide particles or organic particles. The metal oxide particles may be, for example, particles of titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$), and the organic particles may be, for example, particles of an acrylic resin or a urethane resin.

The first scatterer 133 may scatter light in random directions regardless of the incidence direction of the light without changing the wavelength of the light that passes through the first wavelength conversion pattern 130. As a result, the length of the path of the light that passes through the first wavelength conversion pattern 130 may be increased, and the color conversion efficiency of the first wavelength shifter 135 may be improved.

The thickness of the first wavelength conversion pattern 130 may be in a range of about 3 μm to about 15 μm. In a case where the first wavelength conversion pattern 130 may be formed to have a thickness of about 3 μm or greater, the color conversion efficiency of the first wavelength conversion pattern 130 may be improved. The thickness of the first wavelength conversion pattern 130 may be up to about 15 μm.

The content of the first wavelength shifter 135 in the first wavelength conversion pattern 130 may be in a range of about 10% to about 60%. For example, the content of the first scatterer 133 in the first wavelength conversion pattern 130 may be in a range of about 2% to about 10%.

The second wavelength conversion pattern 140 may convert or shift the peak wavelength of incident light into the peak wavelength of another light. The second wavelength conversion pattern 140 may convert blue light L1 into green light L3 having a peak wavelength in a range of about 510 nm to about 550 nm and may emit the green light L3.

The second wavelength conversion pattern 140 may include a second base resin 141 and a second wavelength shifter 145 which may be dispersed in the second base resin 141 and may include a second scatterer 143 which may be dispersed in the second base resin 141.

The material of the second base resin 141 may be formed of the same or similar material as the first base resin 131 and may include at least one of the above-described materials of the first base resin 131.

The second wavelength shifter 145 may convert or shift the peak wavelength of the incident light into a predetermined peak wavelength. The second wavelength shifter 145 may convert blue light L1 having a peak wavelength in a range of about 430 nm to about 470 nm into green light L3 having a peak wavelength in a range of about 510 nm to about 550 nm. Some of the blue light L1 may be emitted through the second wavelength conversion pattern 140 without being converted into green light L3 by the second wavelength shifter 145 and may be blocked by a second color filter 183. The green light L3 produced by the second wavelength conversion pattern 140 may be emitted through the second color filter 183.

Examples of the second wavelength shifter 145 may include quantum dots, quantum rods, and a phosphor. The second wavelength shifter 145 may be substantially the same as, or similar to, the first wavelength shifter 135, and thus, a further detailed description thereof will be omitted.

The first and second wavelength shifters 133 and 143 may both be formed of quantum dots. As an example, the diameter of the quantum dots of the first wavelength shifter 135 may be greater than the diameter of the quantum dots of the second wavelength shifter 145.

The second scatterer 143 may have a different refractive index from the second base resin 141 and may form an optical interface with the second base resin 141. For example, the second scatterer 143 may include light-scattering particles. The second scatterer 143 may be substantially the same as, or similar to, the first scatterer 133, and thus, a further detailed description thereof will be omitted.

The thickness of the second wavelength conversion pattern 140 may be substantially the same as the thickness of the first wavelength conversion pattern 130.

The content of the second wavelength shifter 145 in the second wavelength conversion pattern 140 may be in a range of about 10% to about 60%. The content of the second scatterer 143 in the second wavelength conversion pattern 140 may be in a range of about 2% to about 10%.

The light transmission pattern 150 may transmit incident light therethrough. For example, the light transmission pattern 150 may transmit blue light L1 provided from the third light-emitting area of the third pixel PX3 therethrough as it is. The light transmission pattern 150 may include a third scatterer 153 and may thus scatter blue light L1 in any arbitrary directions.

The light transmission pattern 150 may include a third base resin 151 and the third scatterer 153, which may be dispersed in the third base resin 151.

The material of the third base resin 151 may be formed of the same or similar material as the first base resin 131 and may include at least one of the above-described materials of the first base resin 131.

The third scatterer 153 may have a different refractive index from the third base resin 151 and may form an optical interface with the third base resin 151. For example, the third scatterer 153 may include light-scattering particles. The third scatterer 153 may be substantially the same as, or similar to, the first scatterer 133, and thus, a further detailed description thereof will be omitted.

Blue light L1 provided by the third light-emitting element ED3 may be emitted from the third pixel PX3 through the light transmission pattern 150.

The display panel 100 may be a top emission-type display panel.

Pixel electrodes (AE1, AE2, and AE3) may be located or disposed on the first wavelength conversion pattern 130, the second wavelength conversion pattern 140, and the light transmission pattern 150, respectively. The pixel electrodes (AE1, AE2, and AE3) may be located or disposed in the first, second, and third light-emitting areas, respectively, and may extend into the non-light-emitting areas around the first, second, and third light-emitting areas. The pixel electrodes (AE1, AE2, and AE3) may be connected to the switching elements (T1, T2, and T3) via holes that may penetrate the insulating film 120.

The pixel electrodes (AE1, AE2, and AE3) may be the anode electrodes of organic light-emitting elements.

The pixel electrodes (AE1, AE2, and AE3) may have a multilayer structure. Each of the pixel electrodes (AE1, AE2, and AE3) may include a first conductive pattern which may be located or disposed on the insulating film 120, a second conductive pattern which may be located or disposed on the first conductive pattern, and a third conductive pattern which may be located or disposed on the first wavelength conversion pattern 130, the second wavelength conversion pattern 140, or the light transmission pattern 150.

The first conductive patterns and the second conductive patterns of the pixel electrodes (AE1, AE2, and AE3) may be located or disposed between the insulating film 120 and the first wavelength conversion pattern 130, the second wavelength conversion pattern 140, or the light transmission pattern 150, and the third conductive patterns of the pixel electrodes (AE1, AE2, and AE3) may be located or disposed between an organic layer OL and the wavelength conversion/light transmission patterns (130, 140, and 150).

The first conductive patterns of the pixel electrodes (AE1, AE2, and AE3) may be connected to one of the switching elements (T1, T2, and T3) via a via hole that may penetrate the insulating film 120, and the second conductive pattern of the pixel electrodes (AE1, AE2, and AE3) may be located or disposed between the first conductive pattern and the first wavelength conversion pattern 130, the second wavelength conversion pattern 140, or the light transmission pattern 150.

The third conductive patterns of the pixel electrodes (AE1, AE2, and AE3) may be formed of a high work function material that may facilitate the injection of holes, and the first conductive pattern may include a material that can easily be deposited on the insulating film 120.

The first and third conductive patterns may include a conductive oxide, and the second conductive pattern may include a reflective metal. For example, the first and third conductive patterns may include at least one of indium-tin-oxide (ITO), indium-zinc-oxide (IZO), ZnO, or indium oxide ($In_2O_3$), and the second conductive pattern may include at least one of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and a mixture thereof.

The pixel-defining film 160 may be located or disposed on the pixel electrodes (AE1, AE2, and AE3). The pixel-defining film 160 may be located or disposed along the boundaries of each of the pixels (PX1, PX2, and PX3). The pixel-defining film 160 may be formed in a lattice shape and may include openings that at least may partially expose the pixel electrodes (AE1, AE2, and AE3). As described above, the first, second, and third light-emitting areas and the non-light-emitting areas may be defined by the pixel-defining film 160. For example, parts of the pixel electrodes (AE1, AE2, and AE3) that may not covered, but exposed, by the pixel-defining film 160 may be the first, second, and third light-emitting areas, and parts of the first, second, and third pixel electrodes AE1, AE2, and AE3 that may be covered by the pixel-defining film 160 may be the non-light-emitting areas.

The pixel-defining film 160 may be in direct contact with the third conductive patterns of the pixel electrodes (AE1, AE2, and AE3).

In an embodiment, the pixel-defining film 160 may include an organic insulating material such as an acrylic resin, an epoxy resin, a phenolic resin, a polyamide resin, a polyimide resin, an unsaturated polyester resin, a polyphenylene ether resin, a polyphenylene sulfide resin, or benzocyclobutene (BCB). The organic layer OL may be located or disposed on the pixel electrodes (AE1, AE2, and AE3), which may be exposed by the openings of the pixel-defining film 160. The organic layer OL may provide light emitted by a light-emitting layer, for example, blue light L1, in upward and downward directions. The organic layer OL will hereinafter be described with reference to FIGS. 4A through 4C.

Referring to FIG. 4A, the organic layer OL may include a first hole transport layer HTL1, which may be located or disposed on the first pixel electrode AE1, a first emission layer EL1, which may be located or disposed on the first hole transport layer HTL1, and a first electron transport layer ETL1, which may be located or disposed on the first emission layer EL1. The organic layer OL may include only one emission layer, e.g., the first emission layer EL1, and the first emission layer EL1 may emit blue light L1. However, the structure of the organic layer OL is not particularly limited to that illustrated in FIG. 4A, but may vary, as illustrated in FIGS. 4B and 4C.

Referring to FIG. 4B, an organic layer OLa may include a first charge generation layer CGL1, which may be located or disposed on a first emission layer EL1, and a second emission layer EL2, which may be located or disposed on the first charge generation layer CGL1, and a first charge transport layer ETL1 may be located or disposed on the second emission layer EL2.

The first charge generation layer CGL1 may inject charges into each of the first and second emission layers EL1 and EL2. The first charge generation layer CGL1 may balance the charges between the first and second emission layers EL1 and EL2. The first charge generation layer CGL1 may include n- and p-type charge generation layers. The p-type charge generation layer may be located or disposed on the n-type charge generation layer.

The second emission layer EL2 may emit light of the same peak wavelength as, or a different peak wavelength from, the first emission layer EL1, but the disclosure is not limited thereto. Alternatively, the first and second emission layers EL1 and EL2 may emit light of different colors. For example, the first emission layer EL1 may emit blue light, and the second emission layer EL2 may emit green light.

Since the organic layer OLa may include two emission layers, i.e., the first and second emission layers EL1 and EL2, the emission efficiency and the lifetime of the organic layer OLa may be improved as compared to the organic layer OL of FIG. 4A.

FIG. 4C illustrates an organic layer OLb having two charge generation layers interposed between two charge generation layers. Referring to FIG. 4C, the organic layer OLb may include a first charge generation layer CGL1, which may be located or disposed on a first emission layer EL1, a second emission layer EL2, which may be located or disposed on the first charge generation layer CGL1, a second charge generation layer CGL2, which may be located or disposed on the second emission layer EL2, and a third emission layer EL3, which may be located or disposed on the second charge generation layer CGL2. A first charge transport layer ETL1 may be located or disposed on the third emission layer EL3.

The third emission layer EL3, like the first and second emission layers EL1 and EL2, may emit blue light, but the disclosure is not limited thereto. In an embodiment, the first, second, and third light-emitting layers EL1, EL2, and EL3 may emit blue light having the same peak wavelength or different peak wavelengths. In other embodiments, the first, second, and third light-emitting layers EL1, EL2, and EL3 may emit light of different colors. For example, the first, second, and third light-emitting layers EL1, EL2, and EL3 may emit blue light or green light.

Referring again to FIG. 3, parts of the organic layer OL on the first, second, and third pixel electrodes AE1, AE2, and AE3 may be connected to one another. Even if the parts of the organic layer OL on the first, second, and third pixel electrodes AE1, AE2, and AE3 are all connected, only parts of the organic layer OL that are in contact with the pixel electrodes (AE1, AE2, and AE3) may emit light. If the organic layer OL is formed in common for all the pixels (PX1, PX2, and PX3), the organic layer OL may be formed all at once, which may be desirable in terms of process efficiency.

In an embodiment, unlike in the embodiment of FIG. 3, separate organic layers OL may be formed for different pixels. For example, organic layers OL may be formed on the pixel electrodes (AE1, AE2, and AE3) to be separate from one another. The organic layers OL on the first, second, and third pixel electrodes AE1, AE2, and AE3 may be separated by the pixel-defining film 160. If organic layers OL are formed in the pixels (PX1, PX2, and PX3) to be separate from one another, pixels that are not intended may be prevented from emitting light due to a leakage current.

In an embodiment, some of the films of the organic layer OL may be divided into segments for the respective pixels, and some of the films of the organic layer OL may be formed as common layers for all the pixels (PX1, PX2, and PX3). For example, each of the emission layers of the organic layer OL may be divided into segments for the respective pixels, and each of the hole transport layers and/or the electron transport layer(s) of the organic layer OL may be formed as a common layer.

Referring again to FIG. 4, in a case where the pixel electrodes (AE1, AE2, and AE3) are the anode electrodes of OLEDs, a common electrode CE may be the cathode electrodes of the OLEDs and may include a low work function material that may facilitate the injection of electrons, such as, for example, Li, Ca, LiF/Ca, LiF/Al, Al, Mg, Ag, Pt, Pd, Ni, Au Nd, Ir, Cr, BaF, Ba, or a compound or mixture thereof (e.g., the mixture of Ag and Mg).

In a case where the display panel 100 is a top emission-type display panel, the common electrode CE may have transparency or translucency. If the common electrode CE is formed to be as thin as dozens to hundreds of angstroms, the common electrode CE may have transparency or translucency. In a case where a metallic film having a low work function may be used to form the common electrode CE, the common electrode CE may include a layer of a transparent conductive material such as tungsten oxide (WxOx), titanium oxide ($TiO_2$), ITO, IZO, ZnO, indium-tin-zinc-oxide (ITZO), magnesium oxide (MgO) to secure transparency and reduce resistance.

The first pixel electrode AE1, the organic layer OL, and the common electrode CE may form the first organic light-emitting element ED1, the second pixel electrode AE2, the organic layer OL, and the common electrode CE may form the second organic light-emitting element ED2, and the third pixel electrode AE3, the organic layer OL, and the common electrode CE may form the third organic light-emitting element ED3.

The thin-film encapsulation layer 170 may be located or disposed on the common electrode CE. The thin-film encapsulation layer 170 may be located or disposed on the organic light-emitting elements (ED1, ED2, and ED3) to seal the organic light-emitting elements (ED1, ED2, and ED3) and thus to prevent the penetration of impurities or moisture.

The thin-film encapsulation layer 170 may be located or disposed on the entire surface of the display panel 100 regardless of the pixels (PX1, PX2, and PX3). As illustrated in FIG. 3, the thin-film encapsulation layer 170 may extend even into part of the non-display area NA.

First and second encapsulation inorganic films 171 and 173 of the thin-film encapsulation layer 170 may be formed of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), or lithium fluoride.

An encapsulation organic film 172 of the thin-film encapsulation layer 170 may be formed of an acrylic resin, a methacrylic resin, polyisoprene, a vinyl resin, an epoxy resin, a urethane resin, a cellulose resin, or a perylene resin.

A first inorganic capping layer CPL1 may be located or disposed between the thin-film encapsulation layer 170 and the common electrode CE. The first inorganic capping layer CPL1 may include an inorganic material. The first inorganic capping layer CPL1 may be located or disposed on the common electrode CE and may protect the organic light-emitting elements (ED1, ED2, and ED3), which may be located or disposed in the pixels (PX1, PX2, and PX3).

The light-shielding member BM may be located or disposed on the thin-film encapsulation layer 170.

The light-shielding member BM may be located or disposed along the boundaries between the light-outputting areas (PA1, PA2, and PA3) to block the transmission of light in the non-light-outputting areas PB. The light-shielding member BM may prevent colors from being mixed between the pixels (PX1, PX2, and PX3).

The light-shielding member BM may be arranged in a lattice shape in a plan view. The light-shielding member BM may at least partially overlap the pixel-defining film 160 in the thickness direction.

The light-shielding member BM may include at least one of an organic material, a metallic material containing Cr, and carbon black.

Color filters (181, 183, and 185) may be located or disposed on the light-shielding member BM and the thin-film encapsulation layer 170. The color filters (181, 183, and 185) may be absorptive filters that absorb light of a particular wavelength while transmitting light of another particular wavelength therethrough.

A first color filter 181 may be located or disposed in the first light-outputting area PA1, a second color filter 183 may be located or disposed in the second light-outputting area PA2, and a third color filter 185 may be located or disposed in the third light-outputting area PA3. However, the disclosure is not limited thereto. The color filters (181, 183, and 185) may extend even on the light-shielding member BM.

The first color filter 181 may block or absorb blue light L1 emitted from the first wavelength conversion pattern 130. For example, the first color filter 181 may serve as a blue-light cut filter that blocks blue light and also as a red-light transmission filter that selectively transmits red light therethrough. The first color filter 181 may include a red colorant.

The second color filter 183 may block or absorb blue light L1 emitted from the second wavelength conversion pattern 140. For example, the second color filter 183 may serve as a blue-light cut filter that blocks blue light and also as a green-light transmission filter that selectively transmits green light therethrough. The second color filter 183 may include a green colorant.

The third color filter 185 may serve as a blue-light transmission filter that transmits blue light L1 emitted from the light transmission pattern 150. The third color filter 185 may include a blue colorant.

The color filters (181, 183, and 185) may absorb at least some incident light. For example, since the first color filter 181 functions as a red-light transmission filter, the first color filter 181 may block at least some of external light except for red light. For example, since the second color filter 183 functions as a green-light transmission filter, the first color filter 181 may block at least some of external light except for green light. For example, since the third color filter 185 functions as a blue-light transmission filter, the third color filter 185 may block at least some of external light except for blue light. Accordingly, the first, second, and third color filters 181, 183, and 185 may improve the reflection of external light.

Referring to FIG. 5, as described above, the pixel electrodes (AE1, AE2, and AE3) may have a multilayer structure. The first, second, and third pixel electrodes AE1, AE2, and AE3 may be the same except that they may be located or disposed in different pixels. Thus, the first, second, and third pixel electrodes AE1, AE2, and AE3 will hereinafter be described, taking the first pixel electrode AE1 as an example.

The first pixel electrode AE1 may include a first conductive pattern AE11, which may be located or disposed on the insulating film 120, a second conductive pattern AE12, which may be located or disposed on the first conductive pattern AE11, and a third conductive pattern AE13, which may be located or disposed on the first wavelength conversion pattern 130.

The first and second conductive patterns AE11 and AE12 may be located or disposed between the first wavelength conversion pattern 130 and the insulating film 120, and the third conductive pattern AE13 may be located or disposed between the first wavelength conversion pattern 130 and the organic layer OL.

The first conductive pattern AE1 may be connected to a first switching element T1 via a via hole of the insulating film 120, and the second conductive pattern AE12 may be located or disposed between the first conductive pattern AE11 and the first wavelength conversion pattern 130.

The third conductive pattern AE13 may include a high work function material that may facilitate the injection of holes, and the first conductive pattern AE11 may include a material that may easily be deposited on the insulating film 120.

The first and third conductive patterns AE11 and AE13 may include a conductive oxide, and the second conductive pattern AE12 may include a reflective metal. The materials of the first, second, and third conductive patterns AE11, AE12, and AE13 may be as already described above, and thus, detailed descriptions thereof will be omitted.

The first and second conductive patterns AE11 and AE12 may have the same size in a plan view. The first and second conductive patterns AE11 and AE12 may be located or disposed to overlap each other in the thickness direction. The sides of the first conductive pattern AE11 and the sides of the second conductive pattern AE12 may be aligned in the thickness direction.

The third conductive pattern AE13 may be located or disposed on the top surface and the sides of the first wavelength conversion pattern 130. The third conductive pattern AE13 may cover the sides of the first wavelength conversion pattern 130. Parts of the third conductive pattern AE located or disposed on the sides of the first wavelength conversion pattern 130 may be in direct contact with the top surface of the second conductive pattern AE12, but the disclosure is not limited thereto. Alternatively, the parts of the third conductive pattern AE located or disposed on the sides of the first wavelength conversion pattern 130 may not be in direct contact with the top surface of the second conductive pattern AE12.

As described above, the organic layer OL may emit blue light L1 in the upward and downward directions with respect to the thickness direction. The blue light L1 emitted in the downward direction may be provided to the first wavelength conversion pattern 130 by penetrating at least part of the third conductive pattern AE13.

The blue light L1 provided to the first wavelength conversion pattern 130 may be converted into red light L2 by the first wavelength shifter 135 and may then be emitted in the upward direction.

The red light L2 produced by the first wavelength shifter 135 may be reflected by the second wavelength conversion pattern AE12 and may then be emitted in the upward direction.

Also, the blue light L1 provided to the first wavelength conversion pattern 130 may be reflected by the second conductive pattern AE12, instead of meeting the first wavelength shifter 135, and may then be provided back to the first wavelength conversion pattern 130 so that it can meet the first wavelength shifter 135 and be converted into red light L2 and can be emitted in the upward direction.

Since the wavelength conversion/light transmission patterns (130, 140, and 150) may be located or disposed on a TFT substrate including the switching elements (T1, T2, and T3) and the organic light-emitting elements (ED1, ED2, and ED3), a substrate for arranging the wavelength conversion/light transmission patterns (130, 140, and 150) may not be provided, and processes of bonding the TFT substrate and other substrates may not be performed. Accordingly, manufacturing time and cost can be reduced.

Since a substrate for arranging the wavelength conversion/light transmission patterns (130, 140, and 150) is not needed, the overall thickness of the display device or the display panel 100 can be reduced, and as a result, the thinness and flexibility of the display panel 100 can be improved.

The first and second wavelength conversion patterns 130 and 140 may be located or disposed adjacent to or on the first, second, and third organic light-emitting elements ED1 and ED2. The first and second wavelength conversion patterns 130 and 140 may be adjacent to the organic layer OL, so that the probability that light emitted from the organic layer OL penetrates neighboring pixels may decrease. As a result, color reproducibility can be improved. Since the distance between the organic layer OL and the first and second wavelength conversion patterns 130 and 140 can be considerably reduced, the general efficiency of the display panel 100 including the first, second, and third organic light-emitting elements ED1, ED2, and ED3 can be improved.

A method of manufacturing a display device according to an embodiment of the disclosure will hereinafter be described. Like reference numerals indicate like elements throughout the disclosure, and thus, detailed descriptions thereof will be omitted or simplified.

Figure 6:
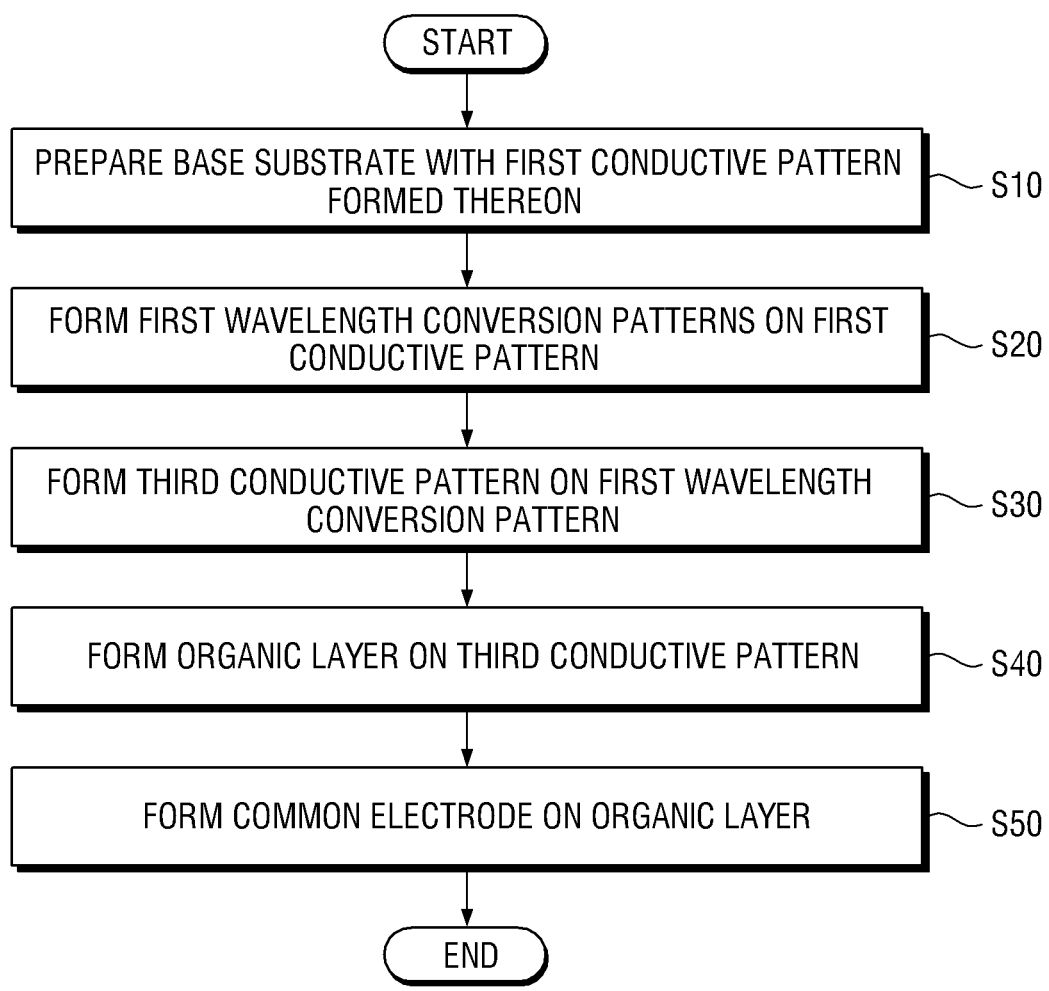
FIG. 6 is a flowchart illustrating a method of manufacturing a display device according to an embodiment.

FIG. 6 is a flowchart illustrating a method of manufacturing a display device according to an embodiment of the disclosure, and FIGS. 7 through 10 are schematic cross-sectional views illustrating the method of FIG. 6.

Figure 7:
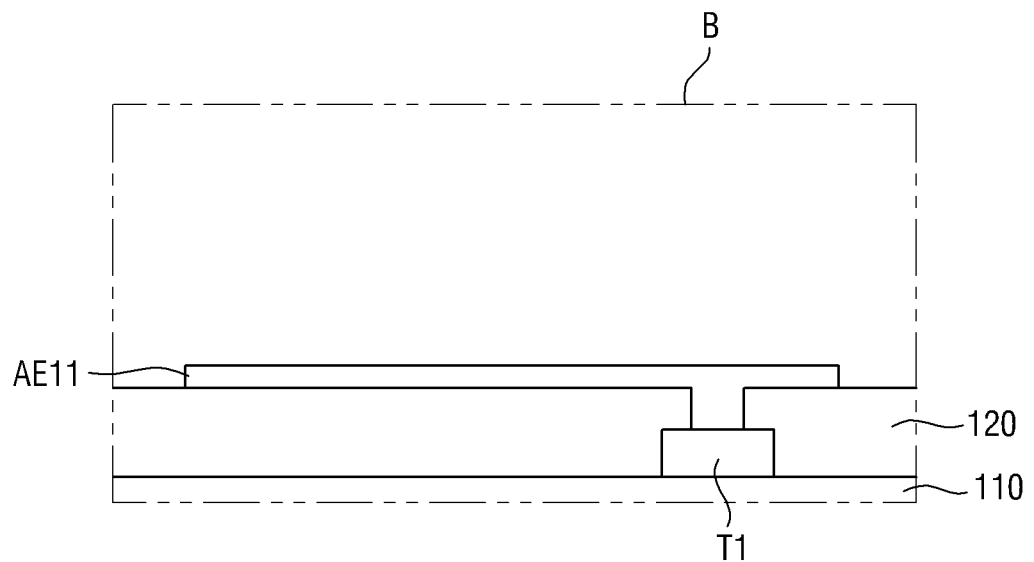
FIGS. 7 through 10 are schematic cross-sectional views illustrating the method of FIG. 6.

Referring to FIGS. 6 and 7, a base substrate 110 with a first conductive pattern AE11 formed thereon may be prepared (S10). The first conductive pattern AE11 may be formed on an insulating film 120. The first conductive pattern AE11 or a first conductive film may include a conductive oxide. It is to be understood that the first conductive pattern may include a first conductive film disposed between the wavelength conversion pattern and the first base substrate, and a second conductive film disposed between the first conductive film and the wavelength conversion pattern.

The material of the first conductive pattern AE11 is as already described above with reference to FIGS. 3 and 5, and thus, a detailed description thereof will be omitted.

The first conductive pattern AE11 may be formed by a method of forming a thin film such as sputtering. However, the disclosure is not limited thereto and the conductive patterns may be formed by other methods of forming a thin film within the spirit and scope of the disclosure.

Figure 8:
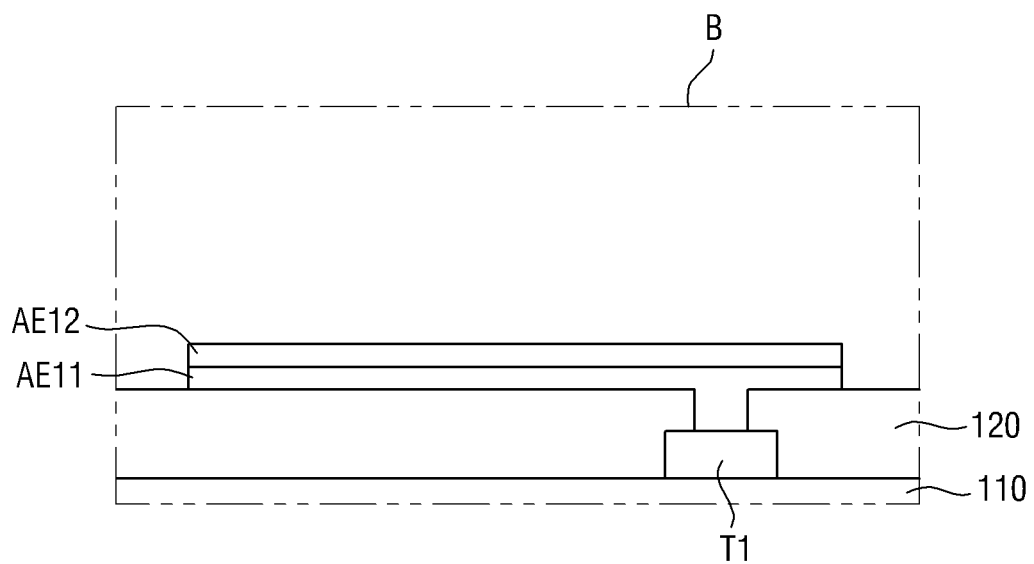

Thereafter, referring to FIGS. 6 and 8, a second conductive pattern AE12 or a second conductive film may be formed on the first conductive pattern AE11.

The second conductive pattern AE12 may be formed to overlap the first conductive pattern AE11 in a thickness direction. The second conductive pattern AE12 may include a reflective conductive material or a reflective metal. The functions and the material of the second conductive pattern AE12 are as already described above with reference to FIGS. 3 and 5, and thus, detailed descriptions thereof will be omitted.

The second conductive pattern AE12 may be formed directly on the top surface of the first conductive pattern AE11.

The second conductive pattern AE12 may be formed by a method of forming a thin film such as sputtering, for example.

Figure 9:
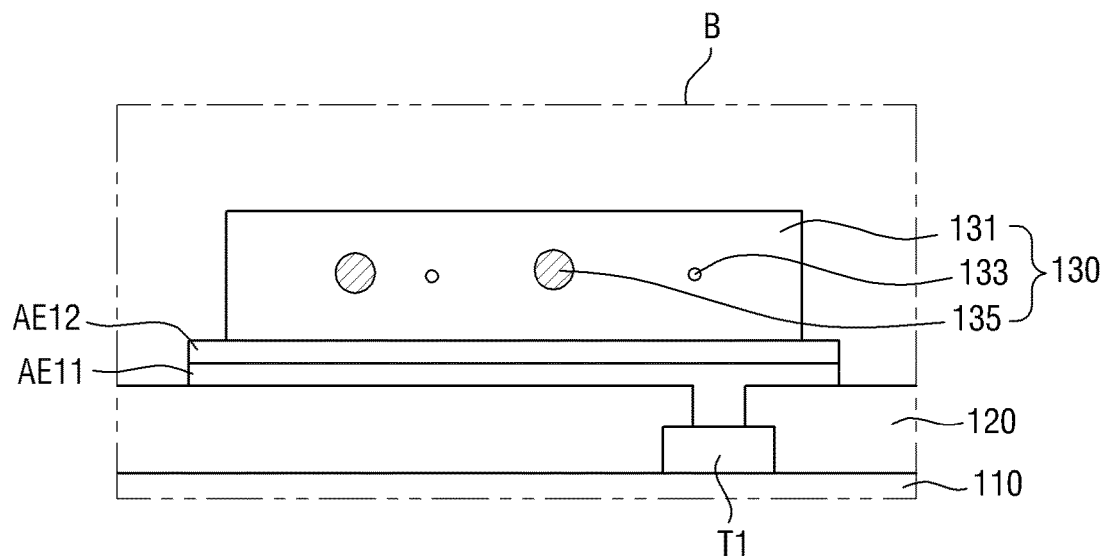

Thereafter, referring to FIGS. 6 and 9, a first wavelength conversion pattern 130 may be formed on the second conductive pattern AE12 (S20). The first wavelength conversion pattern 130 may be formed by photolithography, for example.

The first wavelength conversion pattern 130 may include a first base resin 131 and a first wavelength shifter 135 and a first scatterer 133, which may be dispersed in the first base resin 131. The first wavelength conversion pattern 130 may be formed by applying the first base resin 131, the first wavelength shifter 135, and the first scatterer 133 on the second conductive pattern AE12 and the insulating film 120 and subjecting the first base resin 131, the first wavelength shifter 135, and the first scatterer 133 to ultraviolet (UV) curing and development of photolithography.

In an embodiment, the first wavelength conversion pattern 130 may be formed by inkjet printing.

In an example where barrier walls may be arranged around a region in which to apply the first wavelength conversion pattern 130, the first wavelength conversion pattern 130 may be formed by applying the first base resin 131, the first wavelength shifter 135, and the first scatterer 133 on the inner sides of the barrier walls and subjecting the first base resin 131, the first wavelength shifter 135, and the first scatterer 133 to curing.

The functions and the material of the first wavelength conversion pattern 130 are as already described above with reference to FIGS. 3 and 5, and thus, detailed descriptions thereof will be omitted.

Figure 10:
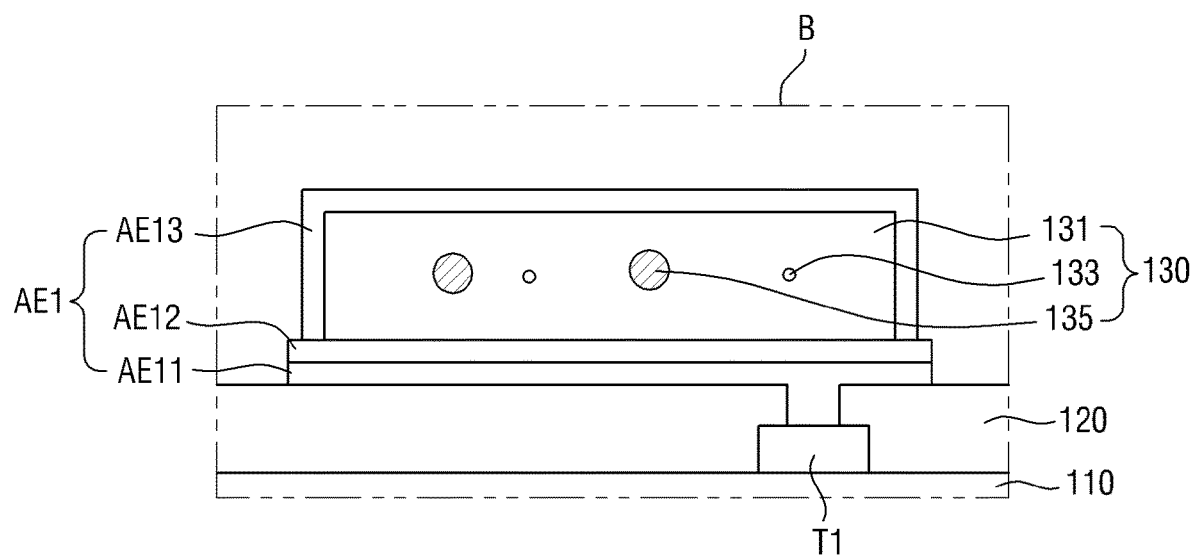

Thereafter, referring to FIGS. 6 and 10, a third conductive pattern AE13 may be formed on the first wavelength conversion pattern 130 (S30).

The third conductive pattern AE13 may be formed to overlap the second conductive pattern AE12 and the first wavelength conversion pattern 130 in the thickness direction.

The step of forming the third conductive pattern AE13 may include forming the third conductive pattern AE13 to cover the sides of the first wavelength conversion pattern 130 and to be in contact with the second conductive pattern AE12.

The third conductive pattern AE13 may include a conductive oxide. The third conductive pattern AE13 may include the same or similar material as the first conductive pattern AE11, but the disclosure is not limited thereto. The functions and the material of the third conductive pattern AE13 are as already described above with reference to FIGS. 3 and 5, and thus, detailed descriptions thereof will be omitted.

In an embodiment, the method of FIG. 6 may include, between the steps of forming the first wavelength conversion pattern 130 on the second conductive pattern AE12 and forming the third conductive pattern AE13 on the first wavelength conversion pattern 130, forming an inorganic capping layer that may cover the sides of the first wavelength conversion pattern 130 and may be in direct contact with the first wavelength conversion pattern 130. In the step of forming the inorganic capping layer, the third conductive pattern AE13 may be formed on the inorganic capping layer.

The step of forming the third conductive pattern AE13 may include forming the third conductive pattern AE13 to extend on the sides of the inorganic capping layer.

Thereafter, referring to FIG. 6, an organic layer OL may be formed on the third conductive pattern AE13 (S40).

The organic layer OL may be formed directly on the top surface of the third conductive pattern AE13.

The organic layer OL is as already described above, and thus, a detailed description thereof will be omitted.

Thereafter, referring to FIG. 6, a common electrode CE may be formed on the organic layer OL (S50).

The common electrode CE is as already described above, and thus, a detailed description thereof will be omitted.

The first, second, and third conductive patterns AE1, AE2, and AE3 may correspond to a first pixel electrode PE1, which may be located or disposed in a first pixel PX1, and the first pixel electrode PE1, the organic layer OL, and the common electrode CE may form a first organic light-emitting element ED1.

According to the embodiment of FIG. 6, since wavelength conversion/light transmission patterns (130, 140, and 150) may be located or disposed on a TFT substrate including switching elements (T1, T2, and T3) and organic light-emitting elements (ED1, ED2, and ED3), a substrate for arranging the wavelength conversion/light transmission patterns (130, 140, and 150) may not be provided, and processes of bonding the TFT substrate and other substrates may not be performed. Accordingly, manufacturing time and cost may be reduced.

By way of example, according to an embodiment of FIG. 6, since a substrate for arranging the wavelength conversion/light transmission patterns (130, 140, and 150) is not needed, the overall thickness of a display device or a display panel 100 may be reduced, and as a result, the thinness and flexibility of the display panel 100 may be improved.

According to an embodiment of FIG. 6, the first and second wavelength conversion patterns 130 and 140 may be located or disposed adjacent to the first, second, and third organic light-emitting elements ED1, ED2, and ED3, and for example, to the organic layer OL, the probability that light emitted from the organic layer OL will penetrate neighboring pixels may decrease, and as a result, color reproducibility may be improved. Since the distance between the organic layer OL and the first and second wavelength conversion patterns 130 and 140 may be considerably reduced, the general efficiency of the display panel 100 including the first, second, and third organic light-emitting elements ED1, ED2, and ED3 may be improved.

Figure 11:
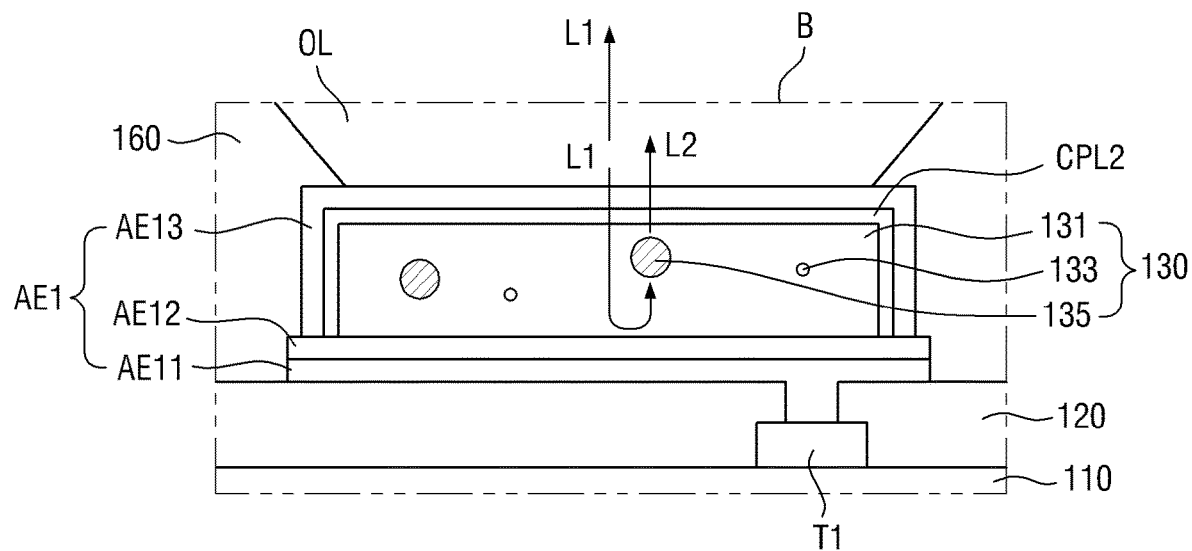
FIG. 11 is a partial schematic cross-sectional view of a display panel of a display device according to an embodiment.

FIG. 11 is a partial schematic cross-sectional view of a display panel of a display device according to an embodiment.

Referring to FIG. 11, a display panel 101 may differ from the display panel 100 of FIG. 5 in that a second inorganic capping layer CPL2 may be located or disposed between a third conductive pattern AE13 and wavelength conversion/light transmission patterns (130, 140, and 150).

As an example, the display panel 101 may include the second inorganic capping layer CPL2, which may be located or disposed between the third conductive pattern AE13 and a first wavelength conversion pattern 130.

The second inorganic capping layer CPL2 may include an inorganic material.

The second inorganic capping layer CPL2 may be located or disposed on the top surface and the sides of the first wavelength conversion pattern 130. The second inorganic capping layer CPL2 may be located or disposed directly on the top surface and the sides of the first wavelength conversion pattern 130 to cover, or completely cover, the top surface and the sides of the first wavelength conversion pattern 130.

The third conductive pattern AE13 may be located or disposed on the top surface and the sides of second inorganic capping layer CPL2. The third conductive pattern AE13 may be located or disposed directly on the top surface and the sides of the second inorganic capping layer CPL2 to cover, or completely cover, the top surface and the sides of the second inorganic capping layer CPL2.

Since the second inorganic capping layer CPL2 may be located or disposed on the top surface and the sides of the first wavelength conversion pattern 130, the first wavelength conversion pattern 130 may be properly sealed.

Figure 12:
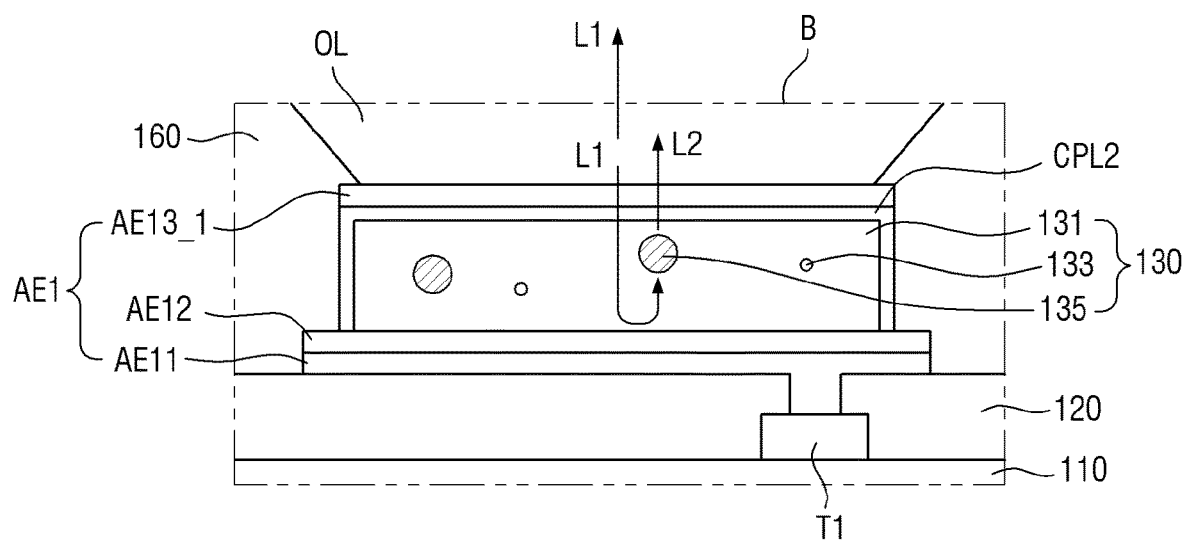
FIG. 12 is a partial schematic cross-sectional view of a display panel of a display device according to an embodiment.

FIG. 12 is a partial schematic cross-sectional view of a display panel of a display device according to an embodiment.

Referring to FIG. 12, a display panel 102 may differ from the display panel 101 of FIG. 11 in that a third conductive pattern AE13_1 may not be located or disposed on the sides of a second inorganic capping layer CPL2.

For example, the third conductive pattern AE13_1 may be located or disposed on the top surface of the second inorganic capping layer CPL2, but not on the sides of the second inorganic capping layer CPL2.

for example, the sides of the third conductive pattern AE13_1 may be located or disposed on the inside of the sides of a first conductive pattern AE11 or a second conductive pattern AE12, which may be located or disposed below the third conductive pattern AE13_1.

The sides of the third conductive pattern AE13_1 may be aligned with the sides of the second inorganic capping layer CPL2, but the disclosure is not limited thereto.

Figure 13:
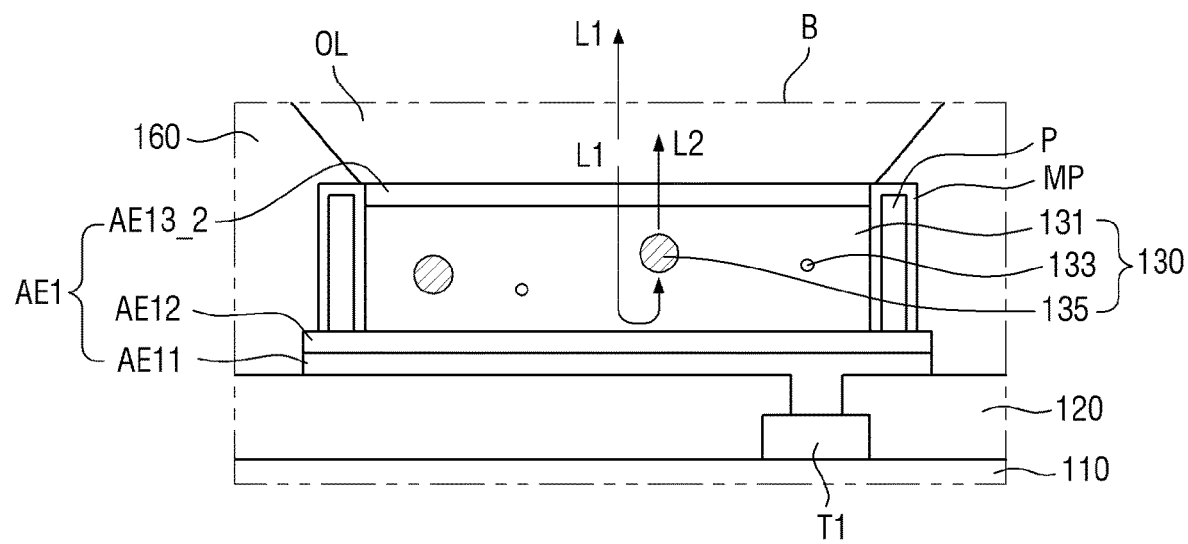
FIG. 13 is a partial schematic cross-sectional view of a display panel of a display device according to an embodiment.

FIG. 13 is a partial schematic cross-sectional view of a display panel of a display device according to an embodiment of the disclosure.

Referring to FIG. 13, a display panel 103 may differ from the display panel 100 in that barrier walls P may be located or disposed between wavelength conversion/light transmission patterns (130, 140, and 150).

For example, the barrier walls P may be located or disposed between the wavelength conversion/light transmission patterns (130, 140, and 150).

The barrier walls P may include at least one of the above-described materials of the light-shielding member BM of the display panel 100, but the disclosure is not limited thereto The barrier walls P may prevent the materials of the wavelength conversion/light transmission patterns (130, 140, and 150) from spilling over to neighboring pixels during the formation of the wavelength conversion/light transmission patterns (130, 140, and 150) by inkjet printing.

The height of the surfaces of the barrier walls P may be greater than the height of the surfaces of the wavelength conversion/light transmission patterns (130, 140, and 150), but the disclosure is not limited thereto. For example, the height of the surfaces of the barrier walls P may be substantially the same as the height of the surfaces of the wavelength conversion/light transmission patterns (130, 140, and 150).

Conductive patterns MP may be located or disposed on the barrier walls P. The conductive patterns MP may reflect light incident upon the barrier walls P from the wavelength conversion/light transmission patterns (130, 140, and 150) while being or not being converted by the wavelength conversion/light transmission patterns (130, 140, and 150), and may thus provide the light back to the wavelength conversion/light transmission patterns (130, 140, and 150).

The conductive patterns MP may be located or disposed on the sides and the top surface of each of the barrier walls P and may cover the sides and the top surface of each of the barrier walls P.

Figure 14:
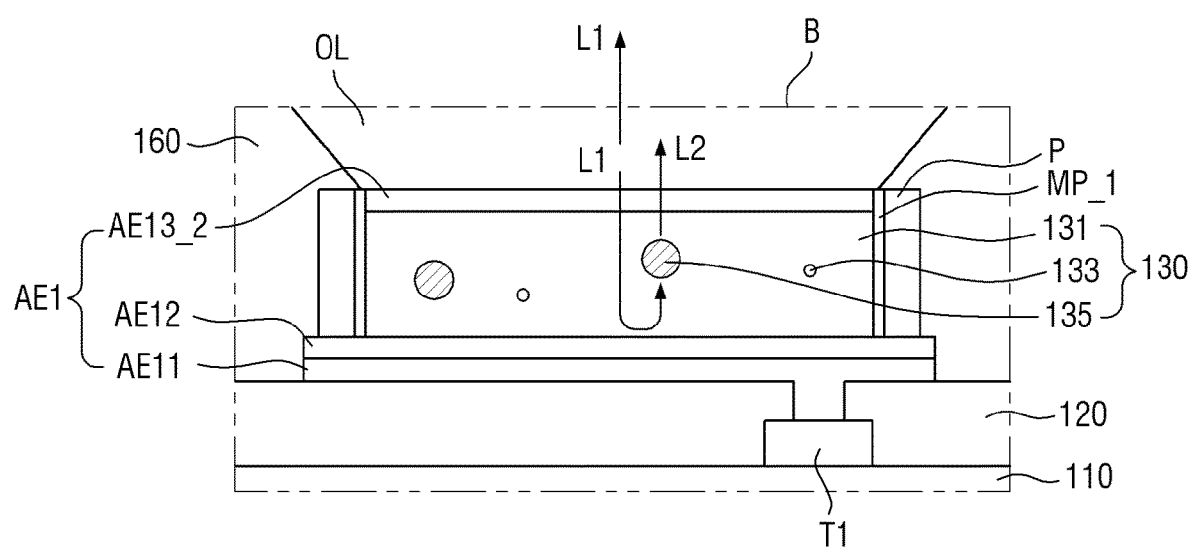
FIG. 14 is a partial schematic cross-sectional view of a display panel of a display device according to an embodiment.

FIG. 14 is a partial schematic cross-sectional view of a display panel of a display device according to an embodiment.

Referring to FIG. 14, a display panel 104 may differ from the display panel 103 of FIG. 13 in that conductive patterns MP_1 may be located or disposed on inner sides of barrier walls P that face wavelength conversion/light transmission patterns (130, 140, and 150), but not on outer sides of the barrier walls P.

Other features of the display panel 104 are similar to as described above with reference to FIG. 13, and thus, detailed descriptions thereof will be omitted.

Figure 15:
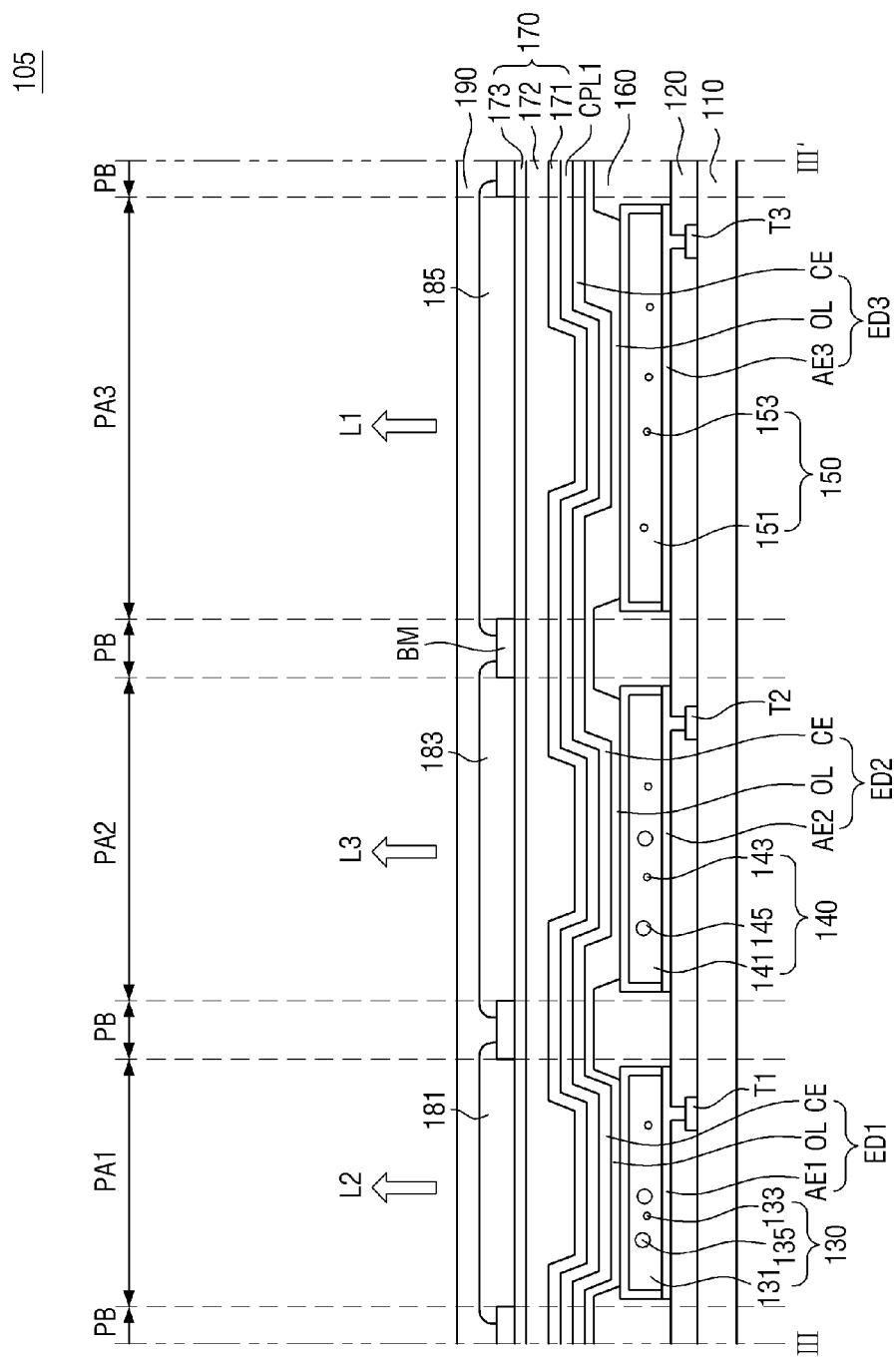
FIG. 15 is a schematic cross-sectional view of a display panel of a display device according to an embodiment.

FIG. 15 is a schematic cross-sectional view of a display panel of a display device according to an embodiment.

Referring to FIG. 15, a display panel 105 may differ from the display panel 100 in that a film 190 may be located or disposed on color filters (181, 183, and 185) and on a light-shielding member BM.

The film 190 may include an organic insulating material, but the disclosure is not limited thereto.

Since the film 190 may be located or disposed on the color filters (181, 183, and 185) and on the light-shielding member BM, the film 190 may protect elements located or disposed therebelow from external shock.

Figure 16:
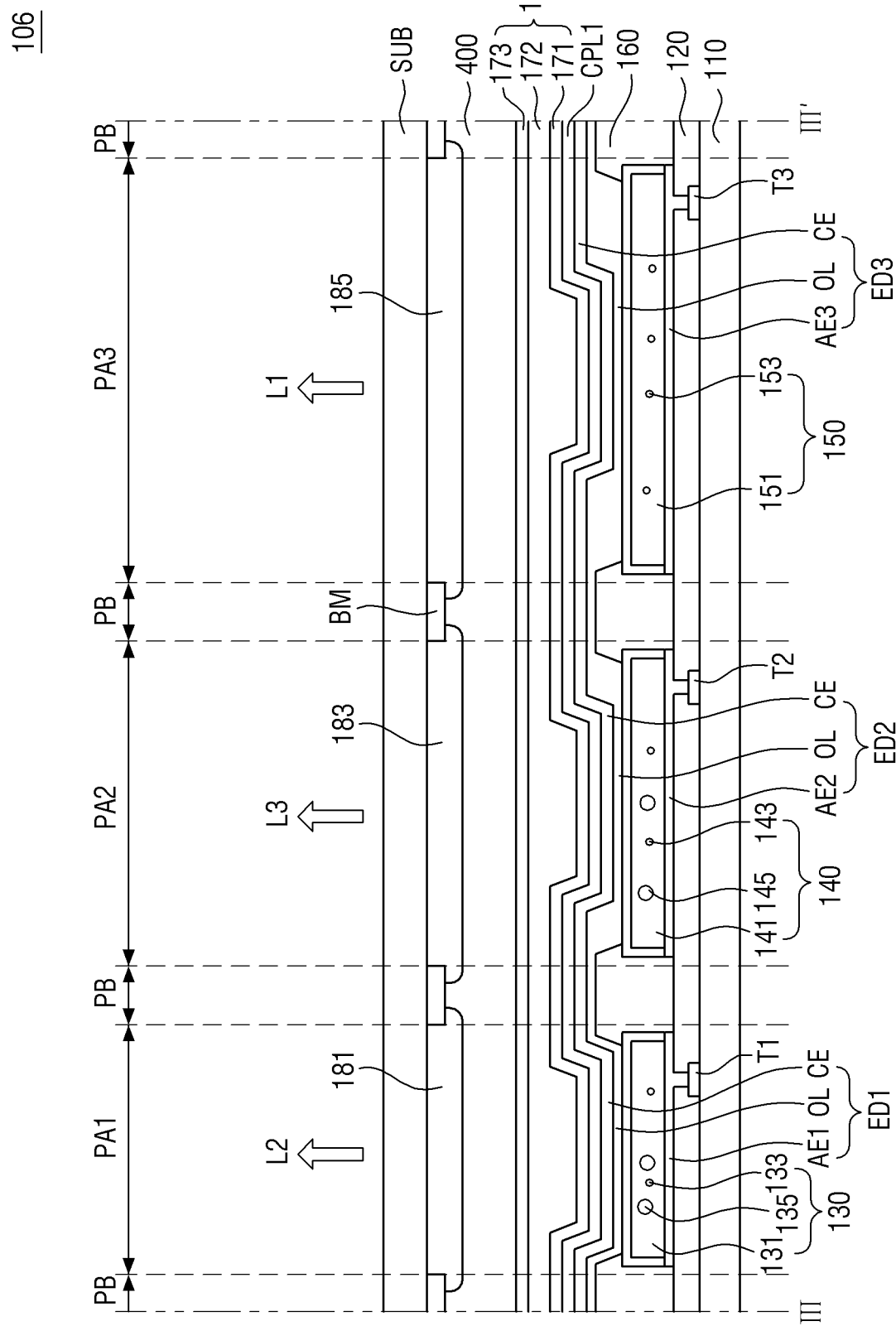
FIG. 16 is a partial schematic cross-sectional view of a display panel of a display device according to an embodiment.

FIG. 16 is a partial schematic cross-sectional view of a display panel of a display device according to an embodiment.

Referring to FIG. 16, a display panel 106 may differ from the display panel 100 in that color filters (181, 183, and 185) and a light-shielding member BM may be formed not on a TFT substrate, but on another substrate.

The display panel 106 may include an upper substrate SUB which may face the TFT substrate. The upper substrate SUB may include at least one of the above-described materials of the base substrate 110 of the display panel 100. For example, the upper substrate may include a rigid material or a flexible material.

The light-shielding member BM may be located or disposed in non-light-emitting areas PB of the upper substrate SUB, and the color filters (181, 183, and 185) may be located or disposed on the upper substrate SUB, in light-emitting areas (PA1, PA2, and PA3) of pixels (PX1, PX2, and PX3).

A filler member 400 may be located or disposed between the color filters (181, 183, and 185) and a thin-film encapsulation layer 170. The display panel 106 may include a sealing member which surrounds the filler member 400 in a plan view.

The filler member 400 may be located or disposed in a space surrounded by the color filters (181, 183, and 185), the thin-film encapsulation layer 170, and the sealing member. The filler member 400 may be formed of a material capable of transmitting light therethrough and may have a buffer function. The filler member 400 may be formed of an organic material. For example, the filler member 400 may be formed of a Si-based organic material, an epoxy-based organic material, or an acrylic organic material, but the disclosure is not limited thereto.

Other features of the display panel 106 may be similar as described above with reference to FIG. 3, and thus, detailed descriptions thereof will be omitted.

Figure 17:
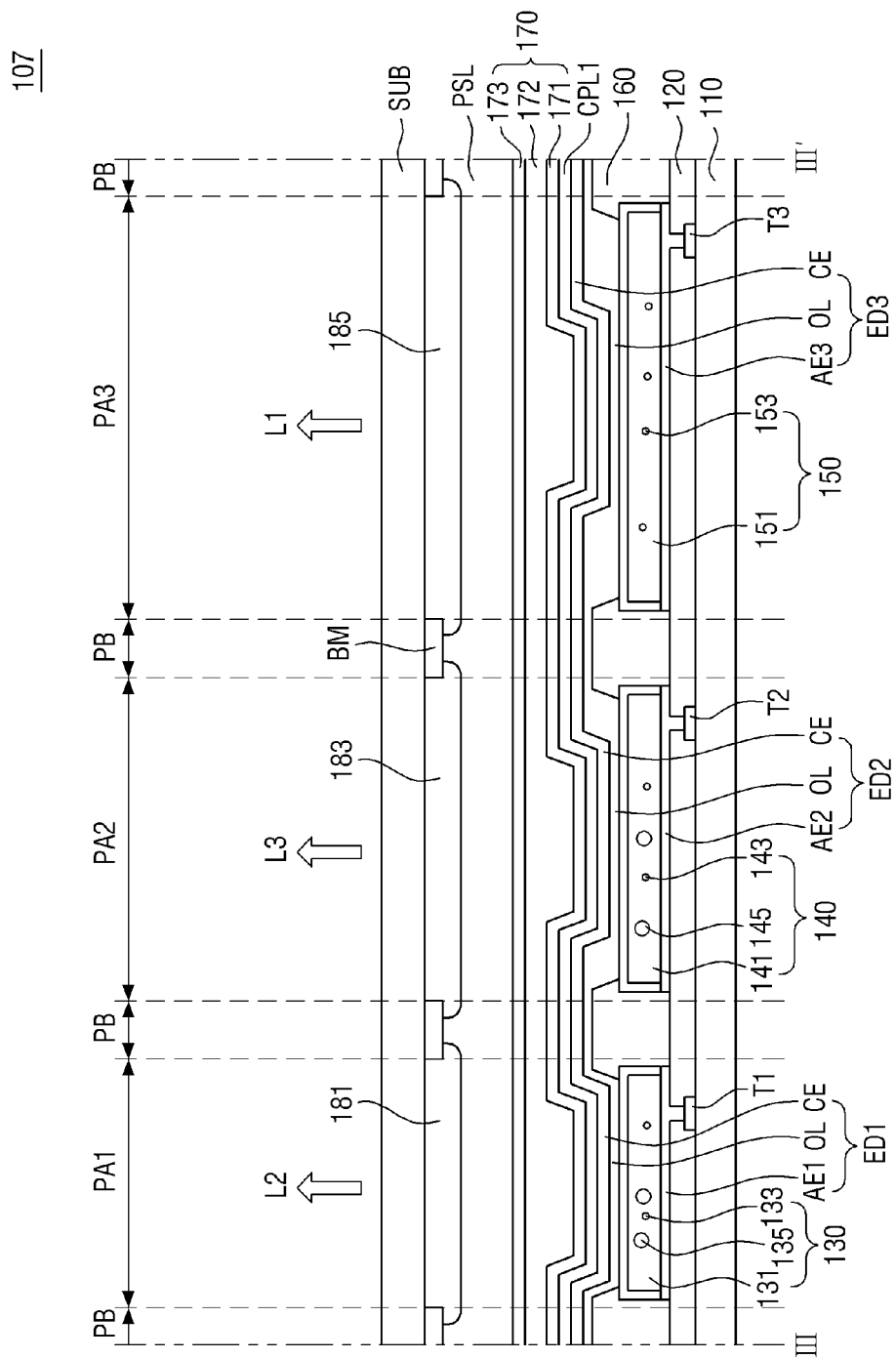
FIG. 17 is a partial schematic cross-sectional view of a display panel of a display device according to an embodiment.

FIG. 17 is a partial schematic cross-sectional view of a display panel of a display device according to an embodiment.

Referring to FIG. 17, a display panel 107 may differ from the display panel 106 of FIG. 16 in that the filler member 400 of FIG. 16 may not be provided, and that a planarization film PSL may be located or disposed between a thin-film encapsulation layer 170 and color filters (181, 183, and 185).

The planarization film PSL may include an organic insulating material.

Other features of the display panel 107 may be similar as described above with reference to FIG. 16, and thus, detailed descriptions thereof will be omitted.

Figure 18:
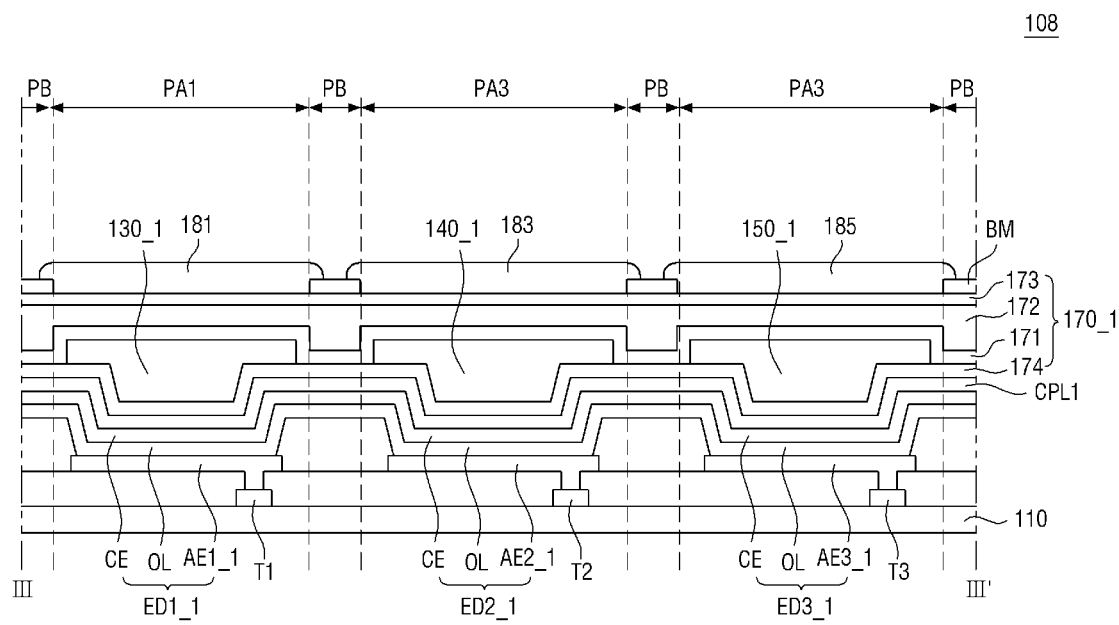
FIG. 18 is a partial schematic cross-sectional view of a display panel of a display device according to an embodiment.

FIG. 18 is a partial schematic cross-sectional view of a display panel of a display device according to an embodiment of the disclosure.

Referring to FIG. 18, a display panel 108 differs from the display panel 100 in that wavelength conversion/light transmission patterns (130_1, 140_1, and 150_1) are located or disposed between a common electrode CE and a thin-film encapsulation layer 170_1.

For example, the wavelength conversion/light transmission patterns (130_1, 140_1, and 150_1) may be located or disposed between the common electrode CE and the thin-film encapsulation layer 170_1.

The thin-film encapsulation layer 170_1 may include a third encapsulation inorganic film 174, which may be located or disposed between a first inorganic capping layer CPL1 and the wavelength conversion/light transmission patterns (130_1, 140_1, and 150_1).

The third encapsulation inorganic film 174 may include the same material as a first encapsulation inorganic film 171, but the disclosure is not limited thereto.

The wavelength conversion/light transmission patterns (130_1, 140_1, and 150_1) may be located or disposed directly on the third encapsulation inorganic film 174.

The first encapsulation inorganic film 171 may be located or disposed directly on the first encapsulation inorganic film 171. The first encapsulation inorganic film 171 may cover and protect the wavelength conversion/light transmission patterns (130_1, 140_1, and 150_1), and the third encapsulation inorganic film 174 may protect the wavelength conversion/light transmission patterns (130_1, 140_1, and 150_1), from below the wavelength conversion/light transmission patterns (130_1, 140_1, and 150_1).

Other features of the display panel 108 are almost the same as described above with reference to FIG. 3, and thus, detailed descriptions thereof will be omitted.

Figure 19:
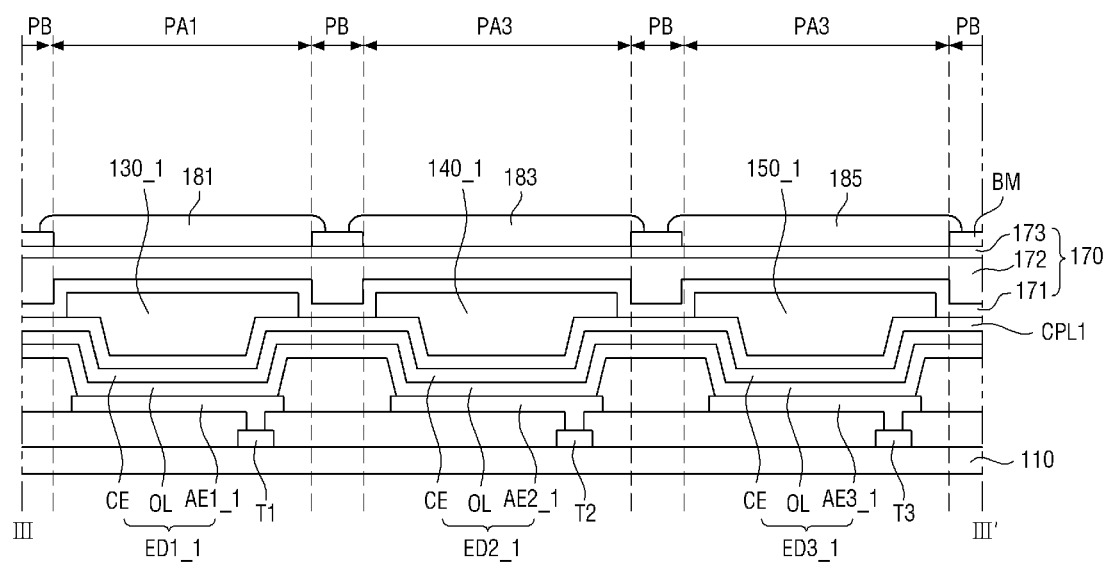
FIG. 19 is a partial schematic cross-sectional view of a display panel of a display device according to an embodiment.

FIG. 19 is a partial schematic cross-sectional view of a display panel of a display device according to an embodiment of the disclosure.

Referring to FIG. 19, a display panel 109 differs from the display panel 108 of FIG. 18 in that the third encapsulation inorganic film 174 of FIG. 18 may not be provided.

For example, wavelength conversion/light transmission patterns (130_1, 140_1, and 150_1) may be located or disposed directly on a first inorganic capping layer CPL1.

Other features of the display panel 108 may be similar as described above with reference to FIG. 3, and thus, detailed descriptions thereof will be omitted.

Figure 20:
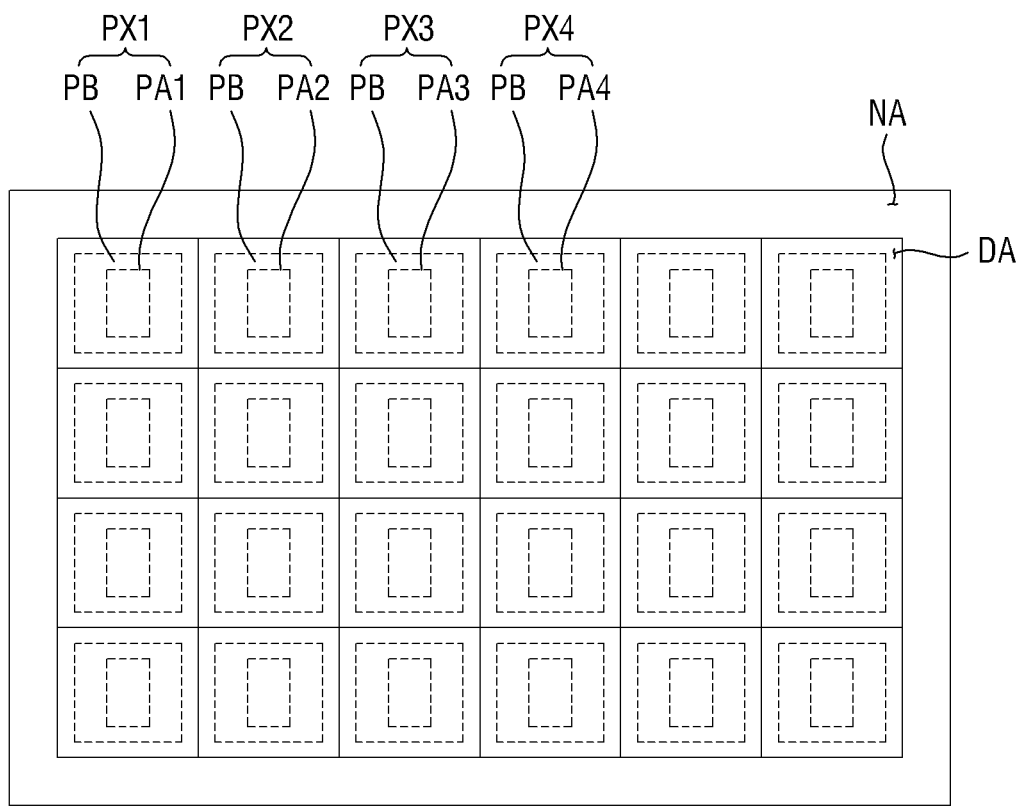
FIG. 20 is a layout view of a display panel of a display device according to an embodiment.
Figure 20:
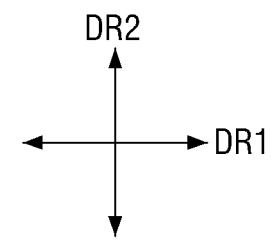
Figure 21:
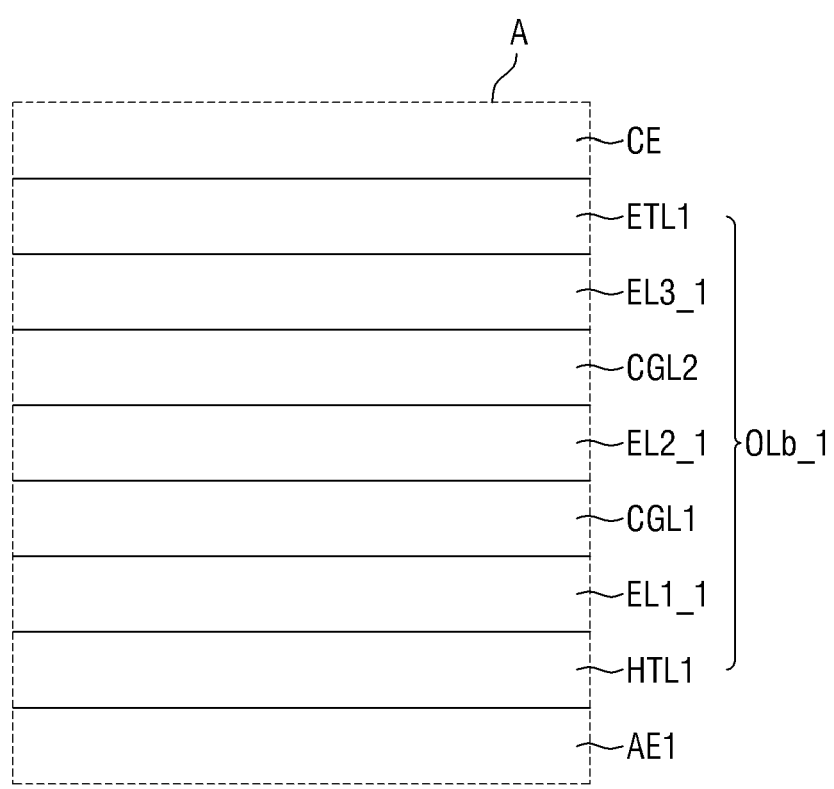
FIG. 21 is a schematic cross-sectional view of an organic layer of the display panel of FIG. 20.

FIG. 20 is a layout view of a display panel of a display device according to an embodiment of the disclosure, and FIG. 21 is a schematic cross-sectional view of an organic layer of the display panel of FIG. 20.

Referring to FIGS. 20 and 21, a display panel 110 differs from the display panel 100 in that it includes a fourth pixel PX4, which emits white light.

For example, the display panel 110 may include the fourth pixel PX4, which emits white light.

The fourth pixel PX4, like a first pixel PX1, may include a non-light-outputting area PB, which does not output light, a fourth light-outputting area PA4, which may be surrounded by the non-light-outputting area PB and emits white light.

Since the display panel 110 includes the fourth pixel PX4, which emits white light, the efficiency and the lifetime of the display panel 110 can be improved.

Referring to FIG. 21, a fourth organic light-emitting element may be located or disposed in the fourth pixel PX4. An organic layer OLb_1 of the fourth organic light-emitting element may include a first emission layer EL1_1, a second emission layer EL2_1, and a third emission layer EL3_1. The order and the structure in which the first, second, and third emission layers EL1_1, EL2_1, and EL3__1 are stacked may be substantially the same as the order and the structure in which the first, second, and third emission layers EL1, EL2, and EL3 of the organic layer OLb of FIG. 4C are stacked, but the organic layer OLb__1 differs from the organic layer OLb of FIG. 4C in that the combination of light emitted from the first, second, and third emission layers EL1_1, EL2_1, and EL3__1 may be white.

For example, one of the first, second, and third emission layers EL1_1, EL2_1, and EL3__1 emits blue light, another one of the first, second, and third emission layers EL1_1, EL2_1, and EL3__1 emits green light, and the other emission layer emits red light.

Other features of the display panel 110 are the same as described above with reference to FIGS. 2 and 4C, and thus, detailed descriptions thereof will be omitted.

Figure 22:
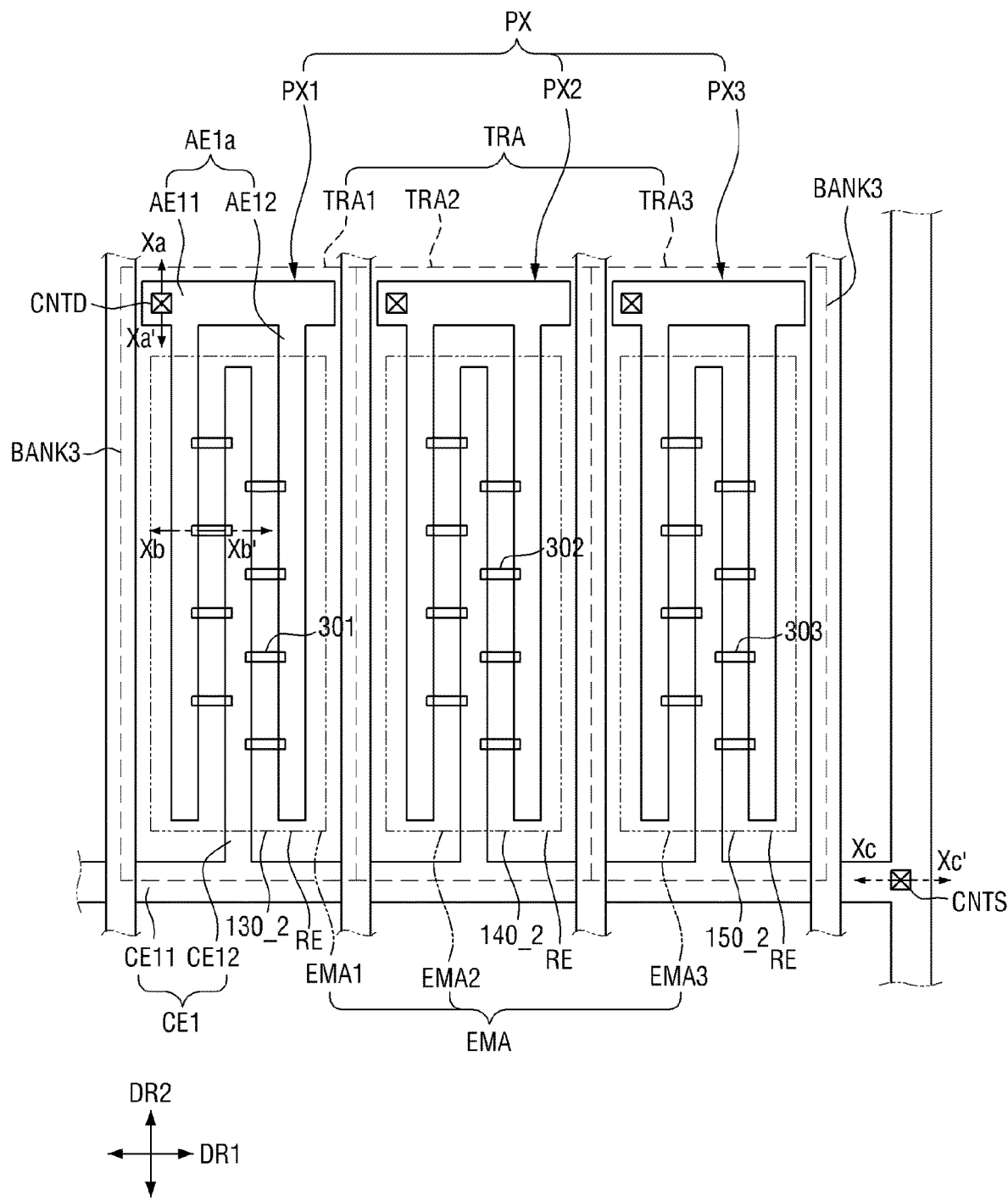
FIG. 22 is a plan view of a pixel of a display device according to an embodiment.
Figure 23:
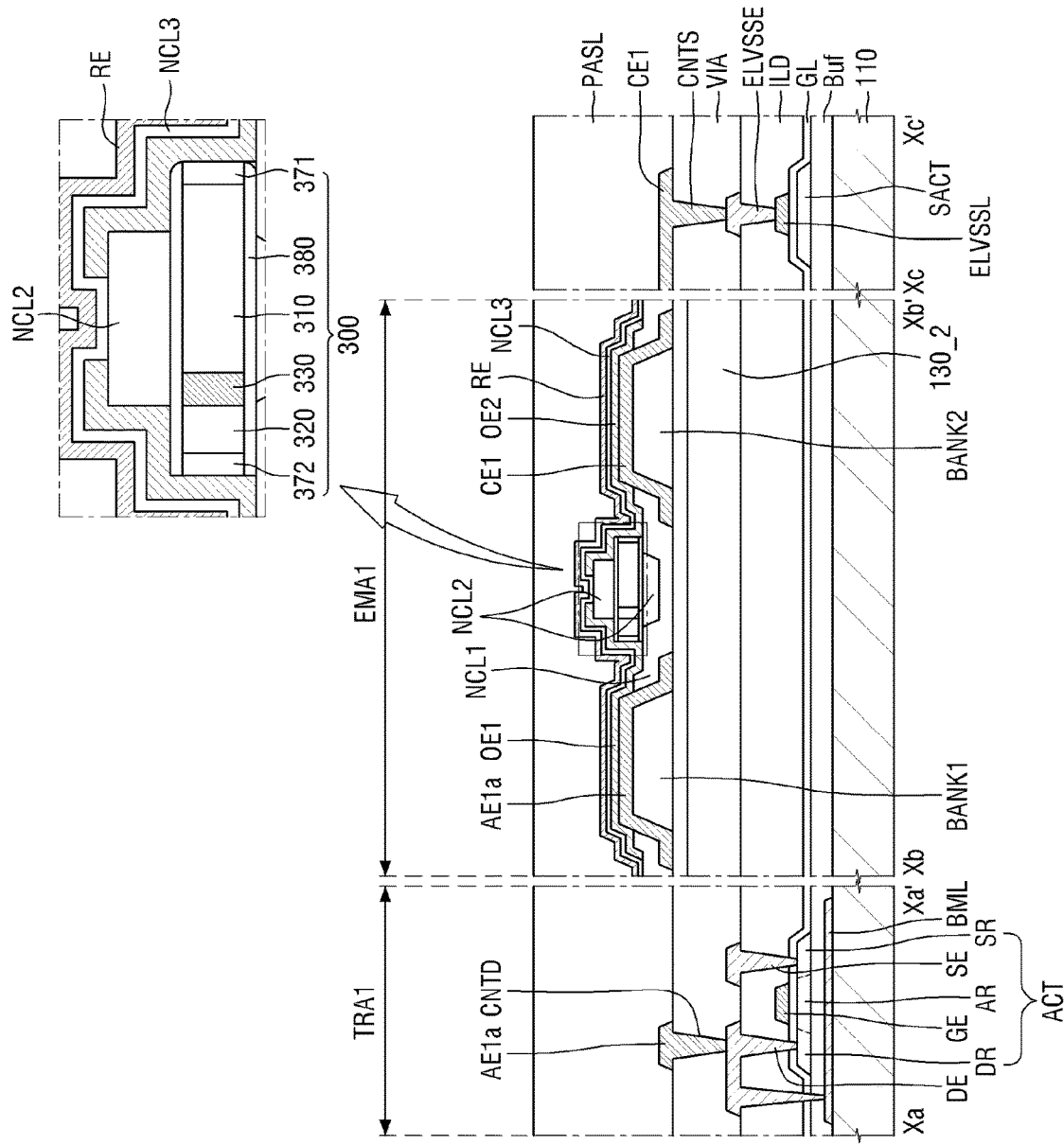
FIG. 23 is a schematic cross-sectional view taken along lines Xa-Xa', Xb-Xb', and Xc-Xc' of FIG. 22.

FIG. 22 is a plan view of a pixel of a display device according to an embodiment, and FIG. 23 is a schematic cross-sectional view taken along lines Xa-Xa', Xb-Xb', and Xc-Xc' of FIG. 22.

FIG. 23 illustrates a schematic cross-sectional view of a first pixel PX1 of FIG. 22, but the schematic cross-sectional structure of the first pixel PX1 may be directly applicable to other first pixels and other non-first pixels. FIG. 23 illustrates a schematic cross-sectional view taken along a line that extends from one end to the other end of a light-emitting element 300 of the first pixel PX1 of FIG. 22.

Referring to FIGS. 22 and 23, pixels PX may include light-emitting areas EMA.

A display panel of the display device of FIG. 22 may be a bottom emission-type display panel. For example, the bottom emission-type display panel may reflect at least some of light emitted upwardly from light-emitting elements 300, which may be located or disposed in the pixels PX, in a downward direction, may provide the reflected light and light emitted downwardly from the light-emitting elements 300 to wavelength conversion/light transmission patterns (130_2, 140_2, and 150_2), and may emit both light produced through wavelength conversion by first and second wavelength conversion patterns 130_2 and 140_2 and light transmitted through a light transmission pattern 150_2 in the downward direction to display a screen to a user.

The first, second, and third pixels PX1, PX2, and PX3 may include first, second, and third light-emitting areas EMA1, EMA2, and EMA3, respectively. The light-emitting areas EMA may be defined as areas in which the light-emitting elements 300 may be located or disposed to emit light of a particular wavelength range. The light-emitting elements 300 may include active layers, and the active layers may emit light of a particular wavelength range with no directionality. For example, light may be emitted from the active layers not only in the directions of both ends of each of the light-emitting elements 300, but also in the directions of the sides of each of the light-emitting elements 300. The light-emitting areas EMA may include the areas where the light-emitting elements 300 may be located or disposed and may include neighboring areas adjacent to the areas where the light-emitting elements 300 may be located or disposed, and the neighboring areas may emit light emitted by the light-emitting elements 300. However, the disclosure is not limited thereto. Alternatively, the light-emitting areas EMA may even include areas that emit light emitted from the light-emitting elements 300 and then reflected or refracted by other elements. The light-emitting elements 300 may be located or disposed in the pixels PX and may form the light-emitting areas EMA, which may include the areas in which the light-emitting elements 300 may be located or disposed and the neighboring areas adjacent to the areas in which the light-emitting elements 300 may be located or disposed.

Although not illustrated, the pixels PX may include non-light-emitting areas, which may be defined as areas other than the light-emitting areas EMA. The non-light-emitting areas may be defined as areas in which the light-emitting elements 300 may not be located or disposed and which do not emit light because of not being reached by light emitted from the light-emitting elements 300. The non-light-emitting areas of the pixels PX may include transistor regions TRA in which switching or driving elements may be located or disposed.

Each of the pixels PX, for example, the first pixel PX1, may include electrodes (AE1*a* and CE1), light-emitting elements 300, banks (BANK1, BANK2, and BANK3), and one or more insulating layers (NCL1, NCL2, PASL, and NCL3).

The electrodes (AE1*a* and CE1) may be electrically connected to the light-emitting elements 300 and may receive a predetermined voltage to allow the light-emitting elements 300 to emit light of a particular wavelength range. At least some of the electrodes (AE1*a* and CE1) may be used to generate an electric field in each of the pixels PX to align the light-emitting elements 300.

The electrodes (AE1*a* and CE1) may include first and second electrodes AE1*a* and CE1. The first electrode AE1*a* may be a pixel electrode separate for each pixel PX, and the second electrode CE1 may be a common electrode formed in common for all the pixels PX. One of the first and second electrodes AE1*a* and CE1 may correspond to the anode electrodes of the light-emitting elements 300, and the other electrode may correspond to the cathode electrodes of the light-emitting elements 300. However, the disclosure is not limited thereto. Alternatively, one of the first and second electrodes AE1*a* and CE1 may correspond to the cathode electrodes of the light-emitting element 300, and the other electrode may correspond to the anode electrodes of the light-emitting elements 300.

The electrodes (AE1*a* and CE1) may include electrode stem parts (AE11 and CE11), which may extend in a first direction DR1, and electrode branch parts (AE12 and CE12), which may extend in a second direction DR2 that may intersect the first direction DR1 and branch off from the electrode stem parts (AE11 and CE11).

The first electrode AE1*a* may include a first electrode stem part AE11, which may extend in the first direction DR1, and one or more first electrode branch parts AE12, which may branch off from the first electrode stem part AE11 and extend in the second direction DR2.

The first electrode stem part AE11 may be spaced apart from the sides of the first pixel PX1 and may be located substantially in line with first electrode stem parts AE11 of the second and third pixels PX2 and PX3 that may belong to the same row as (or are adjacent, in the first direction DR1, to) the first pixel PX. The first electrode stem parts AE11 of the first, second, and third pixels PX1, PX2, and PX3 may be spaced apart from one another and may thus apply different electrical signals, from one another, to their respective groups of first electrode branch parts AE12, and as a result, the groups of first electrode branch parts AE12 of the first, second, and third pixels PX1, PX2, and PX3 may be driven separately.

The first electrode branch parts AE12 may branch off from at least part of the first electrode stem part AE11 and may extend in the second direction DR2 to be spaced apart from a second electrode stem part CE11, which may face the first electrode stem part AE11.

The second electrode CE1 may include the second electrode stem part CE11, which may extend in the first direction DR1 to be spaced apart from, and face, the first electrode stem part AE11, and at least one second electrode branch part CE12, which may branch off from the second electrode stem part CE11 and may extend in the second direction DR2. A part of the second electrode stem part CE11 in the first pixel PX1 may be connected to parts of the second electrode stem parts CE11 in the second and third pixels PX2 and PX3 that may be adjacent to the first pixel PX1 in the first direction DR1. For example, the second electrode stem part CE11, unlike the first electrode stem part AE11, may extend, in the first direction DR1, not only across the first pixel PX1, but also across the second and third pixels PX2 and PX3. The second electrode stem part CE11 may be connected to a part of the common electrode CE1 that may be located or disposed on the outside of a display area DA or in a non-display area NDA to extend in one direction.

The second electrode branch part CE12 may be spaced apart from, and face, the first electrode branch parts AE12 and may be spaced apart from the first electrode stem part AE11. The second electrode branch part CE12 may be connected to the second electrode stem part CE11, and the end of the second electrode branch part CE12 may be located or disposed inside the first pixel PX1 to be spaced apart from the first electrode stem part AE11.

FIGS. 22 and 23 illustrate that two first electrode branch parts AE12 may be provided in the first pixel PX1, and that one second electrode branch part CE12 may be provided between the two first electrode branch parts AE12, but the numbers of first electrode branch parts AE12 and second electrode branch parts CE12 are not particularly limited. As an example, the first and second electrodes AE1a and CE1 may not necessarily extend in one direction, but may be formed in various other shapes. For example, the first and second electrodes AE1a and CE1 may be partially curved or bent, and one of the first and second electrodes AE1a and CE1 may be arranged to surround the other electrode. The structures and the shapes of the first and second electrodes AE1a and CE1 are not particularly limited as long as they can be at least partially spaced apart from, and face, each other to form the spaces therebetween in which to arrange the light-emitting elements 300.

The first and second electrodes AE1a and CE1 may be electrically connected to the switching elements or the driving elements in a first transistor area TRA1 of the first pixel PX1 via contact holes, e.g., first and second electrode contact holes CNTD and CNTS. The first electrode contact hole CNTD is illustrated as being formed in each of the first electrode stem parts AE11 of the first, second, and third pixels PX1, PX2, and PX3, and the second electrode contact hole CNTS is illustrated as being formed in the second electrode stem part CE11 that extends across the first, second, and third pixels PX1, PX2, and PX3. However, the disclosure is not limited thereto. Alternatively, the second electrode contact hole CNTS may also be formed in each of the first, second, and third pixels PX1, PX2, and PX3.

The banks (BANK1, BANK2, and BANK3) may include outer banks BANK3, which may be located or disposed between the pixels PX, and inner banks (BANK1 and BANK2), which may be located or disposed adjacent to the center of each of the pixels PX, below the electrodes (AE1a and CE1). Although not illustrated in FIG. 22, first and second inner banks BANK1 and BANK2 may be located or disposed below the first electrode branch parts AE12 and the second electrode branch part CE12, respectively, as illustrated in FIG. 23.

The outer banks BANK3 may be located or disposed between the pixels PX. The first electrode stem parts AE11 of the pixels PX may be spaced apart from one another by the outer banks BANK3. The outer banks BANK3 may extend in the second direction DR2 and may be located or disposed between pixels PX arranged along the first direction DR1. However, the disclosure is not limited thereto. Alternatively, the outer banks BANK3 may extend in the first direction DR1 and may be located or disposed between pixels PX arranged along the second direction DR2. The outer banks BANK3 may include the same material as the inner banks (BANK1 and BANK2), and the outer banks BANK3 and the inner banks (BANK1 and BANK2) may be formed at the same time by a single process.

The light-emitting elements 300 may be located or disposed between the first and second electrodes AE1a and CE1. The light-emitting elements 300 may be located or disposed between the first electrode branch parts AE12 and the second electrode branch part CE12. First ends of at least some of the light-emitting elements 300 may be electrically connected to the first electrode AE1a, and second ends of the at least some of the light-emitting elements 300 may be electrically connected to the second electrode CE1. Both the first ends and the second ends of the light-emitting elements 300 may be located or disposed on the first electrode branch parts AE12 and the second electrode branch part CE12, but the disclosure is not limited thereto. Alternatively, the first ends and the second ends of the light-emitting elements 300 may be located or disposed between the first and second electrodes AE1a and CE1 not to overlap the first and second electrodes AE1a and CE1.

The light-emitting elements 300 may be spaced apart from one another and may be arranged between the electrodes (AE1a and CE1) to be substantially in parallel to one another. The distance between the light-emitting elements 300 is not particularly limited. Some of the light-emitting elements 300 may be densely grouped together, and some of the light-emitting elements 300 may be less densely grouped together. For example, the light-emitting elements 300 may be aligned and arranged in one direction with non-uniform densities. The light-emitting elements 300 may extend in one direction, and the direction in which the light-emitting elements 300 extend may substantially form a right angle with the direction in which the first and second electrodes AE1a and CE1, for example, the first electrode branch parts AE12 and the second electrode branch part CE12, extend, but the disclosure is not limited thereto. Alternatively, the light-emitting elements 300 may be arranged at an inclination with respect to the direction in which the first electrode branch parts AE12 and the second electrode branch part CE12 may extend.

The light-emitting elements 300 may include active layers having different materials and may thus emit light of different wavelengths. The display device of FIG. 22 may include light-emitting elements 300 that may emit light of different wavelength ranges. The display device of FIG. 22 may include first light-emitting elements 301, which may be located or disposed in the first pixel PX1, second light-emitting elements 302, which may be located or disposed in the second pixel PX2, and third light-emitting elements 303, which may be located or disposed in the third pixel PX3.

The first light-emitting elements 301 and the second light-emitting elements 302 may have the same or similar structure as light-emitting elements 300 of FIG. 3. The first light-emitting elements 301 may include active layers that may emit first light L1 having a first central wavelength range, for example, red light, and the second light-emitting elements 302 may include active layers that emit second light L2 having a second central wavelength range, for example, green light. Accordingly, red light may be emitted from the first pixel PX1, and green light may be emitted from the second pixel PX2. The third light-emitting elements 303 may include active layers that may emit third light L3 having a third central wavelength range, for example, blue light. Accordingly, blue light may be emitted from the third light-emitting elements 303. In an embodiment, the display device of FIG. 22 may include groups of light-emitting elements 300, i.e., the first light-emitting elements 301, the second light-emitting elements 302, and the third light-emitting elements 303, and the active layers of the first light-emitting elements 301, the active layers of the second light-emitting elements 302, and the active layers of the third light-emitting elements 303 may emit light of different colors.

The display device of FIG. 22 may include a first insulating layer NCL1 which may at least partially cover the first and second electrodes AE1a and CE1.

The first insulating layer NCL1 may be located or disposed in each of the first, second, and third pixels PX1, PX2, and PX3. The first insulating layer NCL1 may be located or disposed to cover substantially the entire surfaces of the first, second, and third pixels PX1, PX2, and PX3 and may extend across the first, second, and third pixels PX1, PX2, and PX3. The first insulating layer NCL1 may be located or disposed to at least partially cover the first and second electrodes AE1a and CE1. Although not illustrated in FIG. 22, the first insulating layer NCL1 may be located or disposed to expose parts of the first and second electrodes AE1a and CE1, for example, parts of the first electrode branch parts AE12 and of the second electrode branch part CE12.

The display device of FIG. 22 may include a circuit element layer, which may be located or disposed between the electrodes (AE1a and CE1), a second insulating layer NCL2, which may be located or disposed to at least partially cover the electrodes (AE1a and CE1) and the light-emitting elements 300, and a passivation layer PASL.

The display panel of the display device of FIG. 22 may include wavelength conversion/light transmission patterns (130_2, 140_2, and 150_2), which may be located or disposed below the light-emitting elements 300. The wavelength conversion/light transmission patterns (130_2, 140_2, and 150_2) may be located or disposed in the pixels PX. For example, a first wavelength conversion pattern 130_2 may be located or disposed in the first pixel PX1, a second wavelength conversion pattern 140_2 may be located or disposed in the second pixel PX2, and a light transmission pattern 150_2 may be located or disposed in the third pixel PX3.

The wavelength conversion/light transmission patterns (130_2, 140_2, and 150_2) may be located or disposed in light-emitting areas EMA of the pixels PX, but not in non-light-emitting areas of the pixels PX. For example, the wavelength conversion/light transmission patterns (130_2, 140_2, and 150_2) may not be located or disposed in the transistor areas TRA of the non-light-emitting areas of the pixels PX.

The wavelength conversion/light transmission patterns (130_2, 140_2, and 150_2) may be the same as or similar to their respective counterparts of FIG. 3, and thus, further detailed descriptions thereof will be omitted.

As illustrated in FIG. 23, the display device of FIG. 22 may include a base substrate 110, a buffer layer buf, a light-shielding layer BML, and a transistor and may include the electrodes (AE1a and CE1), the light-emitting elements 300, and the insulating layers (NCL1, NCL2, PASL, and NCL3), which may be located or disposed above the transistor.

The light-shielding layer BML may be located or disposed on the base substrate 110. The light-shielding layer BML may be electrically connected to a drain electrode DE or a first doping region DR of the transistor.

The light-shielding layer BML may be located or disposed to overlap an active material layer ACT of the transistor. The light-shielding layer BML may include a material that blocks the transmission of light and may thus prevent light from being upon the active material layer ACT. For example, the light-shielding layer BML may be formed of an opaque metallic material that may block the transmission of light, but the disclosure is not limited thereto. The light-shielding layer BML may not be provided.

The buffer layer buf may be located or disposed on the light-shielding layer BML and the base substrate 110. The buffer layer buf may include the light-shielding layer BML and may be located or disposed to cover the entire surface of the base substrate 110. The buffer layer buf may prevent the diffusion of impurity ions and the penetration of moisture and external air and may perform a surface planarization function.

A semiconductor layer may be located or disposed on the buffer layer buf. The semiconductor layer may include the active material layer ACT and an auxiliary layer SACT. The semiconductor layer may include polycrystalline silicon, monocrystalline silicon, or an oxide semiconductor.

The active material layer ACT may include the first doping region DR, a second doping region SR, and a channel region AR. The channel region AR may be located or disposed between the first and second doping regions DR and SR. The active material layer ACT may include polycrystalline silicon, which may be formed by crystallizing amorphous silicon. For example, polycrystalline silicon may be formed by rapid thermal annealing (RTA), solid phase crystallization (SPC), excimer laser annealing (ELA), metal induced crystallization (MILC), or sequential lateral solidification (SLS), but the disclosure is not limited thereto.

A first gate insulating film GL may be located or disposed on the semiconductor layer. The first gate insulating film GL may include the semiconductor layer and may be located or disposed to cover the entire surface of the buffer layer buf. The first gate insulating film GL may serve as the gate insulating film of the transistor.

A first conductive layer may be located or disposed on the first gate insulating film GL. The first conductive layer may include, on the first gate insulating film GL, a gate electrode GE, which may be located or disposed on the active material layer ACT of the transistor, and a power supply wire ELVSSL, which may be located or disposed on the auxiliary layer SACT. The gate electrode GE may overlap the channel region AR of the active material layer ACT.

An interlayer insulating film ILD may be located or disposed on the first conductive layer. The interlayer insulating film ILD may include an organic insulating material and may perform not only the functions of an interlayer insulating film, but also a surface planarization function.

A second conductive layer may be located or disposed on the interlayer insulating film ILD. The second conductive layer may include the drain electrode DE and a source electrode SE of the transistor and a power supply electrode ELVS SE, which may be located or disposed on the power supply wire ELVSSL.

The drain electrode DE and the source electrode SE may be in contact with the first and second doping regions SR and DR, respectively, of the active material layer ACT via contact holes that penetrate the interlayer insulating film ILD and the first gate insulating film GL. The drain electrode DE may be electrically connected to the light-shielding layer BML via another contact hole.

A via layer VIA may be located or disposed on the second conductive layer. The via layer VIA may include an organic insulating material and may perform a surface planarization function.

The banks (BANK1, BANK2, and BANK3), the electrodes (AE1a and CE1), and the light-emitting elements 300 may be located or disposed on the via layer VIA.

The banks (BANK1, BANK2, and BANK3) may include the inner banks (BANK1 and BANK2), which may be located or disposed in the pixels PX to be spaced apart from one another, and the outer banks BANK3, which may be located or disposed between the pixels PX.

During the fabrication of the display device of FIG. 22, the outer banks BANK3 may prevent ink sprayed by an inkjet printing device into each of the pixels PX to form the light-emitting elements 300 from spilling over to neighboring pixels PX, but the disclosure is not limited thereto.

The inner banks (BANK1 and BANK2) may include the first and second inner banks BANK1 and BANK2, which may be located or disposed adjacent to the center of the first pixel PX1.

The first and second inner banks BANK1 and BANK2 may be located or disposed to be spaced apart from, and face, each other. The first electrode AE1a may be located or disposed on the first inner bank BANK1, and the second electrode CE1 may be located or disposed on the second inner bank BANK2. It may be understood that the first electrode branch parts AE12 may be located or disposed on the first inner bank BANK1, and that the second electrode branch part CE12 may be located or disposed on the second inner bank BANK2.

The first and second inner banks BANK1 and BANK2 may be located or disposed in the first pixel PX1 to extend in the second direction DR2. Although not illustrated, the first and second inner banks BANK1 and BANK2 may extend in the second direction DR2 toward pixels PX that may be adjacent to the first pixel PX1 in the second direction DR2, but the disclosure is not limited thereto. The inner banks (BANK1 and BANK2) may be located or disposed in each of the pixels PX to form patterns at the front of the display device of FIG. 22. The banks (BANK1, BANK2, and BANK3) may include polyimide (PI), but the disclosure is not limited thereto.

The first and second inner banks BANK1 and BANK2 may at least partially protrude with respect to the via layer VIA. The first and second inner banks BANK1 and BANK2 may protrude upwardly with respect to a plane where the light-emitting elements 300 may be located or disposed, and parts of the first and second inner banks BANK1 and BANK2 that protrude may be at least partially inclined. The shape in which the first and second inner banks BANK1 and BANK2 protrude is not particularly limited.

The electrodes (AE1a and CE1) may be located or disposed on the via layer VIA and the inner banks (BANK1 and BANK2). As described above, the electrodes (AE1a and CE1) may include the electrode stem parts (AE11 and CE11) and the electrode branch parts (AE12 and CE12). Xa-Xa' of FIG. 22 is a line that extends across the first electrode stem part AE11, Xb-Xb' of FIG. 22 is a line that extends across one of the first electrode branch parts AE12 and the second electrode branch part CE12, and Xc-Xc' of FIG. 22 is a line that extends across the second electrode stem part CE11. For example, it may be understood that part of the first electrode AE1a illustrated in the "Xa-Xa'" section of FIG. 23 is the first electrode stem part AE12, and that parts of the first and second electrodes AE1a and CE1 illustrated in the "Xb-Xb'" section of FIG. 23 are one of the first electrode branch parts AE12 and the second electrode branch part CE12, respectively, and that part of the second electrode CE1 illustrated in "Xc-Xc'" section of FIG. 23 is the second electrode stem part CE11. The electrode stem parts (AE11 and CE11) and the electrode branch parts (AE12 and CE12) may form the first and second electrodes AE1a and CE1.

The first and second electrodes AE1a and CE1 may be located or disposed in part on the via layer VIA and in part on the first and second inner banks BANK1 and BANK2. As described above, the first electrode stem part AE11 of the first electrode AE1a and the second electrode stem part CE11 of the second electrode CE1 may extend in the first direction DR1, and the first and second inner banks BANK1 and BANK may extend, in the second direction DR2, across the pixels PX. Although not illustrated, the first and second electrode stem parts AE11 and CE11 of the first and second electrodes AE1a and CE1, which may extend in the first direction DR1, may partially overlap the first and second inner banks BANK1 and BANK2, but the disclosure is not limited thereto. Alternatively, the first and second electrode stem parts AE11 and CE11 may not overlap the first and second inner banks BANK1 and BANK2.

A first electrode contact hole CNDT may be formed in the first electrode stem part AE11 of the first electrode AE1a to penetrate the via layer VIA and thus to expose part of the drain electrode DE of the transistor. The first electrode AE1a may be in contact with the drain electrode DE via the first electrode contact hole CNTD. The first electrode AE1a may be electrically connected to the drain electrode DE and may thus receive electrical signals.

The second electrode stem part CE11 of the second electrode CE1 may extend in one direction and may be located or disposed even in the non-light-emitting areas where the light-emitting elements 300 may not be located or disposed. A second electrode contact hole CNTS may be formed in the second electrode stem part CE11 to penetrate the via layer VIA and thus to expose part of the power supply electrode ELVSSE. The second electrode CE1 may be in contact with the power supply electrode ELVSSE via the second electrode contact hole CNTS. The second electrode CE1 may be electrically connected to the power supply electrode ELVSSE and may thus receive electrical signals from the power supply electrode ELVSSE.

Parts of the first and second electrodes AE1a and CE1, for example, the first electrode branch parts AE12 and the second electrode branch part CE12, may be located or disposed on the first and second inner banks BANK1 and BANK2. The first electrode branch parts AE12 of the first electrode AE1a may be located or disposed to cover the first inner bank BANK1, and the second electrode branch part CE12 of the second electrode CE1 may be located or disposed to cover the second inner bank BANK2. Since the first and second inner banks BANK1 and BANK2 may be spaced apart from each other at the center of the first pixel PX1, the first electrode branch parts AE12 and the second electrode branch part CE12 may also be spaced apart from each other. The light-emitting elements 300 may be located or disposed in areas between the first and second electrodes AE1a and CE1, i.e., in areas where the first electrode branch parts AE12 face the second electrode branch part CE12.

The electrodes (AE1a and CE1) may include a transparent conductive material. For example, the electrodes (AE1a and CE1) may include a material such as ITO, IZO, or ITZO, but the disclosure is not limited thereto. In an embodiment, the electrodes (AE1a and CE1) may be formed of a highly reflective conductive material. For example, the electrodes (AE1a and CE1) may include a highly reflective metal such as Ag, copper (Cu), or Al. In this example, light incident upon the electrodes (AE1a and CE1) may be reflected to be emitted upwardly.

The electrodes (AE1a and CE1) may be formed as stacks of layers of a transparent conductive material and a highly reflective metal or may be formed as single-layer films including the transparent conductive material and the highly reflective metal. Each of the electrodes (AE1a and CE1) may have a stack of ITO/Ag/ITO/IZO or may include an alloy containing Al, nickel (Ni), or lanthanum (La), but the disclosure is not limited thereto.

The first insulating layer NCL1 may be located or disposed on the via layer VIA and the first and second electrodes AE1a and CE1. The first insulating layer NCL1 may be located or disposed to partially cover the first and second electrodes AE1a and CE1. The first insulating layer NCL1 may be located or disposed to cover most of the top surfaces of the first and second electrodes AE1a and CE1, but may partially expose the first and second electrodes AE1a and CE1. The first insulating layer NCL1 may be located or disposed to expose parts of the top surfaces of the first and second electrodes AE1*a* and CE1, for example, parts of the top surfaces of the first electrode branch parts AE1*a*, which may be located or disposed on the first inner bank BANK1, and part of the top surface of the second electrode branch part CE12, which may be located or disposed on the second inner bank BANK2. For example, the first insulating layer NCL1 may be formed on the entire surface of the via layer VIA and may include openings that partially expose the first and second electrodes AE1*a* and CE1. The openings of the first insulating layer NCL1 may be located or disposed to expose relatively flat parts of the top surfaces of the first and second electrodes AE1*a* and CE1.

The first insulating layer NCL1 may be formed to be recessed at the top thereof between the first and second electrodes AE1*a* and CE1. In an embodiment, the first insulating layer NCL1 may include an inorganic insulating material, and part of the top surface of the first insulating layer NCL1 that may cover the first and second electrodes AE1*a* and CE1 may be recessed due to the difference in height between the elements located or disposed below the first insulating layer NCL1. Light-emitting elements 300 located or disposed on the first insulating layer NCL1, between the first and second electrodes AE1*a* and CE1, may form empty spaces on the recessed part of the top surface of the first insulating layer NCL1. The light-emitting elements 300 may be located or disposed to be partially spaced apart from the top surface of the first insulating layer NCL1, and the material of the second insulating layer NCL2 may fill the empty spaces between the first insulating layer NCL1 and the light-emitting elements 300.

Alternatively, the first insulating layer NCL1 may form a flat top surface on which to arrange the light-emitting elements 300. The flat top surface of the first insulating layer NCL1 may extend in one direction toward the first and second electrodes AE1*a* and CE1 and may be terminated on the inclined sides of the first and second electrodes AE1*a* and CE1. For example, the first insulating layer NCL1 may be located or disposed in the overlapping areas of the first and second electrodes AE1*a* and CE1 and inclined sides of the first and second inner banks BANK1 and BANK2. Contact electrodes (OE1 and OE2) may be in contact with exposed parts of the first and second electrodes AE1*a* and CE1 and may also be in contact with the ends of the light-emitting elements 300 over the flat top surface of the first insulating layer NCL1.

The first insulating layer NCL1 may protect the first and second electrodes AE1*a* and CE1 and may insulate the first and second electrodes AE1*a* and CE1 from each other. For example, the first insulating layer NCL1 may prevent the light-emitting elements 300, which may be located or disposed on the first insulating layer NCL1, from being in contact with, and damaged by, other elements. The shape and the structure of the first insulating layer NCL1 are not particularly limited.

The light-emitting elements 300 may be located or disposed on the first insulating layer NCL1, between the electrodes (AE1*a* and CE1). For example, at least one light-emitting element 300 may be located or disposed on part of the first insulating layer NCL1 between the electrode branch parts (AE12 and CE12), but the disclosure is not limited thereto. Alternatively, at least some of the light-emitting elements 300 may be located or disposed in areas other than areas between the electrode branch parts (AE12 and CE12). As an example, the light-emitting elements 300 may be located or disposed in the overlapping area of the electrodes (AE1*a* and CE1). The light-emitting elements 300 may be located or disposed on sides of the electrode branch parts (AE12 and CE12) that face one another, and may be electrically connected to the electrodes (AE1*a* and CE1) via the contact electrodes (OE1 and OE2).

As described above, active layers that emit light L of the same wavelength may be located or disposed in each of the pixels PX, and light-emitting elements 300 that emit light of different wavelengths, i.e., first, second, and third light L1, L2, and L3, may be provided in each of the pixels PX. FIG. 23 illustrates only the first pixel PX1 in which a first light-emitting element 301 may be located or disposed, but the structure of the first pixel PX1 including the first light-emitting element 301 may also be directly applicable to the second and third pixels PX2 and PX3.

In each of the light-emitting elements 300, multiple layers may be located or disposed in a direction parallel to the via layer VIA. Each of the light-emitting elements 300 may include a first semiconductor layer 310, a second semiconductor layer 320, and an active layer 360, which may be sequentially arranged in the direction parallel to the via layer VIA, but the disclosure is not limited thereto. The order in which the multiple layers of each of the light-emitting elements may be arranged is not particularly limited, and alternatively, the multiple layers of each of the light-emitting elements 300 may be arranged in a direction perpendicular to the via layer VIA.

Each of the light-emitting elements 300 may include first and second electrode layers 371 and 372. The first electrode layer 371 may be in contact with a second contact electrode OE2, and the second electrode layer 372 may be in contact with a first contact electrode OE1. The first contact electrode OE1 may be in contact with the second electrode layer 372 and with a first surface of an insulating film 380 and a third surface of the insulating film 380 that may be adjacent to the second electrode layer 372, and the second contact electrode OE2 may be in contact with the first electrode layer 371 and with the first surface and a second surface of the insulating film 380 that may be adjacent to the first electrode layer 371. However, the disclosure is not limited thereto. Alternatively, the display device of FIG. 22 may include light-emitting elements 300 each having first and second electrode layers 371 and 372 in contact with the first and second contact electrodes OE1 and OE2, respectively. The light-emitting elements 300 may extend in one direction, and a length of the first semiconductor layer 310 may be greater than a length of the second semiconductor layer 320. The first electrode layer 371 may be further apart than the second electrode layer 372 from the active layer 360.

The second insulating layer NCL2 may be located or disposed on parts of the light-emitting elements 300. The second insulating layer NCL2 may be located or disposed to surround parts of the outer surfaces of the light-emitting elements 300. The second insulating layer NCL2 may protect the light-emitting elements 300 and may fix the light-emitting elements 300 during the fabrication of the display device of FIG. 22. The second insulating layer NCL2 may be located or disposed in part between the bottom surfaces of the light-emitting elements and the first insulating layer NCL1. As described above, the second insulating layer NCL2 may be formed to fill the spaces between the first insulating layer NCL1 and the light-emitting elements 300. Accordingly, the second insulating layer NCL2 may be formed to surround the outer surfaces of the light-emitting elements 300, but the disclosure is not limited thereto.

In a plan view, the second insulating layer NCL2 may be located or disposed to extend in the second direction DR2 between the first electrode branch parts AE12 and the second electrode branch part CE12. For example, in a plan view, the second insulating layer NCL2 may have an island or linear shape on the via layer VIA.

The contact electrodes (OE1 and OE2) may be located or disposed on the electrodes (AE1a and CE1) and the second insulating layer NCL2. The first and second contact electrodes OE1 and OE2 may be located or disposed on the second insulating layer NCL2 to be spaced apart from each other. The second insulating layer NCL2 may insulate the first and second contact electrodes OE1 and OE2 from each other so that the first and second electrodes OE1 and OE2 may be prevented from being in direct contact with each other.

Although not illustrated, the contact electrodes (OE1 and OE2) may extend in the second direction DR2 and may be spaced apart from each other in the first direction DR1. The contact electrodes (OE1 and OE2) may be in contact with at least first ends of the light-emitting elements 300 and may be electrically connected to the first or second electrode AE1a or CE1 to receive electric signals. The contact electrodes (OE1 and OE2) may include the first and second contact electrodes OE1 and OE2. The first contact electrode OE1 may be located or disposed on the first electrode branch parts AE12 and may be in contact with the first ends of the light-emitting elements 300, and the second contact electrode OE2 may be located or disposed on the second electrode branch part CE12 and may be in contact with second ends of the light-emitting elements 300.

The first contact electrode OE1 may be in contact with some exposed parts of the first electrode AE1 on the first inner bank BANK1, and the second contact electrode OE2 may be in contact with some exposed parts of the second electrode CE1 on the second inner bank BANK2. The contact electrodes (OE1 and OE2) may transmit electric signals received from the electrodes (AE1a and CE1) to the light-emitting elements 300.

The contact electrodes (OE1 and OE2) may include a conductive material. For example, the contact electrodes (OE1 and OE2) may include ITO, IZO, ITZO, or Al, but the disclosure is not limited thereto.

The passivation layer PASL may be located or disposed on the first contact electrode OE1, the second contact electrode OE2, and the second insulating layer NCL2. The passivation layer PASL may protect the elements located or disposed on the via layer VIA from an external environment.

The second insulating layer NCL2 and the passivation layer PASL may include an inorganic insulating material or an organic insulating material. For example, the second insulating layer NCL2 and the passivation layer PASL may include an inorganic insulating material such as silicon oxide (SiOx), silicon nitride (SiNx), silicon oxynitride (SiOxNy), aluminum oxide ($Al_2O_3$), or aluminum nitride (AlN), but the disclosure is not limited thereto. In an example, the second insulating layer NCL2 and the passivation layer PASL may include an organic insulating material such as an acrylic resin, an epoxy resin, a phenolic resin, a polyamide resin, a polyimide resin, an unsaturated polyester resin, a polyphenylene resin, a polyphenylene sulfide resin, BCB, a cardo resin, a siloxane resin, a silsesquioxane resin, polymethyl methacrylate, polycarbonate, or a polymethyl methacrylate-polycarbonate synthetic resin, but the disclosure is not limited thereto.

The display device of FIG. 22 may include insulating layers other than those illustrated in FIG. 23. The display device may include a third insulating layer NCL3, which may be located or disposed to protect the first contact electrode OE1.

The third insulating layer NLC3 may be located or disposed on the first and second contact electrodes OE1 and OE2 in a light-emitting area EMA of the first pixel PX1. The third insulating layer NCL3 may include at least one of the above-described materials of the first insulating layer NCL1. The third insulating layer NCL3 may be located or disposed on the first and second contact electrodes OE1 and OE2 in the light-emitting area EMA of the first pixel PX1 and may thus insulate the first and second contact electrodes OE1 and OE2 from a conductive pattern RE. The third insulating layer NCL3 may prevent the first and second contact electrodes OE1 and OE2 from being electrically connected by the conductive pattern RE, i.e., from being short-circuited.

The third insulating layer NCL3 may be located or disposed in light-emitting areas EMA, but not in non-light-emitting areas. Alternatively, in an embodiment, the third insulating layer NCL3 may be located or disposed in the non-light-emitting areas.

The display panel of the display device of FIG. 22 may include wavelength conversion/light transmission patterns (130_2, 140_2, and 150_2). The wavelength conversion/light transmission patterns (130_2, 140_2, and 150_2) may be located or disposed between an interlayer insulating layer ILD and the via layer VIA.

The wavelength conversion/light transmission patterns (130_2, 140_2, and 150_2) may be located or disposed in the light-emitting areas EMA, but not in the non-light-emitting areas.

As described above, in the bottom emission-type display panel of the display device of FIG. 22, at least some of light emitted upwardly from the light-emitting elements 300 may be reflected by the conductive pattern RE or a reflective electrode to travel downwardly. Light emitted downwardly from the light-emitting elements 300 and the light reflected by the reflective electrode to travel downwardly may both enter the wavelength conversion/light transmission patterns (130_2, 140_2, and 150_2).

As previously described with reference to FIG. 3, first and second wavelength conversion patterns 130_2 and 140_2 may wavelength-convert and/or scatter light provided thereto and may thus emit light downwardly, and a light transmission pattern 150_2 may scatter light provided thereto and may thus emit light downwardly.

Although not illustrated, color filters may be located or disposed below the wavelength conversion/light transmission patterns (130_2, 140_2, and 150_2). The color filters may include a red color filter, which may be located or disposed in the first pixel PX1, a green color filter, which may be located or disposed in the second pixel PX2, and a blue color filter, which may be located or disposed in the third pixel PX3. The color filters are as already described above with reference to FIG. 3, and thus, a further detailed description thereof will be omitted.

While embodiments are described herein, it is not intended that these embodiments describe all possible forms of the disclosure. Rather, the description in the specification is that of description rather than limitation, and it is understood that various changes may be made without departing from the spirit and scope of the disclosure. Additionally, the features of various implementing embodiments may be combined to form further embodiments of the disclosure.

What is claimed is:

1. A display device comprising:
   a first base substrate including a light-emitting area and a non-light-emitting area around the light-emitting area;
   a wavelength conversion pattern disposed on the first base substrate, in the light-emitting area; and a light-emitting element layer disposed on the wavelength conversion pattern, the light-emitting element layer including:
  a pixel electrode including:
    a first conductive pattern disposed between the wavelength conversion pattern and the first base substrate; and
    a second conductive pattern disposed on the wavelength conversion pattern and spaced apart from the first conductive pattern;
  an organic light-emitting layer disposed on the second conductive pattern; and
  a common electrode disposed on the organic light-emitting layer.

2. The display device of claim 1, wherein the first conductive pattern includes:
  a first conductive film disposed between the wavelength conversion pattern and the first base substrate; and
  a second conductive film disposed between the first conductive film and the wavelength conversion pattern.

3. The display device of claim 2, wherein
  the first conductive film includes a conductive oxide,
  the second conductive film includes a metal, and
  the second conductive pattern includes a conductive oxide.

4. The display device of claim 2, wherein the second conductive pattern covers sides of the wavelength conversion pattern and contacts the second conductive film.

5. The display device of claim 4, further comprising:
  a pixel-defining film disposed on the first base substrate, in the non-light-emitting area,
  wherein the pixel-defining film contacts sides of the second conductive pattern.

6. The display device of claim 2, further comprising:
  an inorganic capping layer disposed on sides of the wavelength conversion pattern,
  wherein the second conductive pattern is disposed on the inorganic capping layer.

7. The display device of claim 6, wherein the second conductive pattern is disposed on sides of the inorganic capping layer.

8. The display device of claim 6, wherein the inorganic capping layer covers and contacts the sides of the wavelength conversion pattern.

9. The display device of claim 2, further comprising:
  a barrier wall disposed on sides of the wavelength conversion pattern and the second conductive pattern; and
  a third conductive pattern disposed between a side of the barrier wall and a side of the wavelength conversion pattern.

10. The display device of claim 9, wherein the third conductive pattern covers sides and a top surface of the barrier wall.

11. The display device of claim 1, wherein the wavelength conversion pattern includes wavelength conversion particles that convert the wavelength of light emitted from the light-emitting element layer.

12. The display device of claim 11, wherein the wavelength conversion pattern further includes scattering particles that scatter the light emitted from the light-emitting element layer.

13. The display device of claim 1, wherein the organic light-emitting layer includes two or more organic layers.

14. The display device of claim 1, further comprising:
  a thin-film encapsulation layer disposed on the common electrode and spaced apart from the pixel electrode; and
  a color filter disposed on the thin-film encapsulation layer and spaced apart from the common electrode.

15. The display device of claim 14, further comprising:
  a second base substrate disposed on the color filter; and
  a filler member disposed between the color filter and the thin-film encapsulation layer.

16. A display device comprising:
  a base substrate including a light-emitting area and a non-light-emitting area around the light-emitting area;
  a wavelength conversion pattern disposed on the base substrate in the light-emitting area; and
  a light-emitting element layer disposed between the wavelength conversion pattern and the base substrate, the light-emitting element layer including:
    a pixel electrode disposed between the wavelength conversion pattern and the base substrate;
    an organic light-emitting layer disposed between the wavelength conversion pattern and the pixel electrode;
    a common electrode disposed between the organic light-emitting layer and the wavelength conversion pattern; and
    a first inorganic film on the common electrode, the inorganic layer directly contacting a bottom surface of the wavelength conversion pattern.

17. The display device of claim 16, further comprising:
  an inorganic capping layer disposed between the common electrode and the first inorganic film, wherein
  the inorganic capping layer directly contacts both the first inorganic film and the common electrode, and
  no organic layer is disposed directly between the common electrode and the wavelength conversion pattern.

18. The display device of claim 17, further comprising:
  a second inorganic encapsulation film disposed on the wavelength conversion pattern;
  an organic encapsulation film disposed on the second inorganic encapsulation film; and
  a third inorganic encapsulation film disposed on the organic encapsulation film.

* * * * *